United States Patent
Konttinen et al.

(10) Patent No.: US 7,660,500 B2
(45) Date of Patent: Feb. 9, 2010

(54) LIGHT EMITTING ARRAY

(75) Inventors: Janne Konttinen, Tampere (FI); Tomi Jouhti, Helsinki (FI); Pietari Tuomisto, Tampere (FI)

(73) Assignee: EpiCrystals Oy, Tampere (FI)

( * ) Notice: Subject to any disclaimer, the term of this patent is extended or adjusted under 35 U.S.C. 154(b) by 316 days.

(21) Appl. No.: 11/802,356

(22) Filed: May 22, 2007

(65) Prior Publication Data

US 2008/0291951 A1    Nov. 27, 2008

(51) Int. Cl.
  G02B 6/34    (2006.01)
  G03B 21/00   (2006.01)
  H01S 3/10    (2006.01)

(52) U.S. Cl. .............................. 385/37; 353/31; 353/94; 372/21

(58) Field of Classification Search ................ 385/37; 353/31, 94; 372/21
See application file for complete search history.

(56) References Cited

U.S. PATENT DOCUMENTS

| | | | |
|---|---|---|---|
| 5,715,021 A | 2/1998 | Gibeau | |
| 6,072,815 A | 6/2000 | Peterson | |
| 6,081,541 A | 6/2000 | Adachi | |
| 6,483,556 B1 | 11/2002 | Karakawa et al. | |
| 6,683,901 B2 * | 1/2004 | Caprara et al. | 372/92 |
| 7,123,393 B2 * | 10/2006 | Dubois et al. | 359/27 |
| 7,296,897 B2 * | 11/2007 | Mooradian et al. | 353/31 |
| 7,322,704 B2 * | 1/2008 | Shchegrov | 353/94 |
| 7,355,657 B2 * | 4/2008 | Chilla et al. | 348/744 |
| 7,359,420 B2 * | 4/2008 | Shchegrov et al. | 372/50.124 |
| 7,404,929 B2 * | 7/2008 | Fulghum, Jr. | 422/82.05 |
| 7,492,506 B1 * | 2/2009 | Kamijima | 359/326 |
| 2003/0030756 A1 | 2/2003 | Kane | |
| 2006/0023757 A1 * | 2/2006 | Mooradian et al. | 372/18 |

(Continued)

FOREIGN PATENT DOCUMENTS

GB    2 296 813 A    7/1996

(Continued)

OTHER PUBLICATIONS

Kalle Ventola et al.; Comparison of Metallic and Dielectric Sub-Wavelength Gratings in Conical Diffraction for Polarization Conversion; Optical Society of America; 2007; pp. 1-8.

(Continued)

*Primary Examiner*—Brian M. Healy
*Assistant Examiner*—Guy G Anderson
(74) *Attorney, Agent, or Firm*—Venable LLP; Eric J. Franklin

(57) ABSTRACT

A light emitting device including an array of light emitters to emit first light pulses. Each of the light emitters includes a saturable absorber and a waveguide having an electrically pumped gain region to emit the first light pulses. At least one reflector structure reflects the first light pulses into a nonlinear crystal by changing the direction of the first light pulses by an angle that is in a range of 70 to 110 degrees. The reflector structure includes a sub-wavelength grating structure to change the polarization of the first light pulses. A nonlinear crystal generates second light pulses such that the optical frequency of the second light pulses is two times the optical frequency of the first light pulses.

14 Claims, 13 Drawing Sheets

U.S. PATENT DOCUMENTS

2008/0247427 A1* 10/2008 Bloom ........................ 372/21

FOREIGN PATENT DOCUMENTS

WO     WO 2004/075362 A2     9/2004

OTHER PUBLICATIONS

Jacob B. Khurgin et al.; Modeling of Q-switched Semiconductor Lasers Based on Type-II Quantum Wells; Increasing the Pulse Energy and Peak Power; Applied Physics Letters; vol. 80, No. 15; Apr. 15, 2002; pp. 2631-2633.

International Search Report, issued on Sep. 10, 2008, in connection with counterpart Application No. PCT/FI2008/050295.

Nicolas Passilly et al., "Polarization conversion in conical diffraction by metallic and dielectric subwavelength gratings," Applied Optics, vol. 46, No. 20, pp. 4258-4265, Jul. 10, 2007.

* cited by examiner

LIGHT EMITTING ARRAY

FIELD OF THE INVENTION

The present invention relates to light-emitting devices, in particular to devices which are adapted to emit light for visual applications.

BACKGROUND OF THE INVENTION

An image projector may comprise a light source to provide light for a modulator array. Light transmitted or reflected from the pixels of said modulator array may be subsequently projected on an external screen by projecting optics in order to display images.

The high optical intensity and the low divergence provided by a laser light source would be attractive properties when implementing an image projector. However, the wavelengths of powerful semiconductor laser emitters are typically in the red or infrared (IR) regions.

It is known that blue and/or green light for visual applications may be generated by frequency-doubling. Patent publication US 2006/23757 discloses a mode-locked surface-emitting laser having a nonlinear crystal for frequency-doubling.

SUMMARY OF THE INVENTION

The object of the invention is to provide a device adapted to emit light at one or more visible wavelengths.

According to a first aspect of the invention, there is provided a light emitting device comprising:
an array of light emitters to emit first light pulses, each of said light emitters in turn comprising a saturable absorber and a waveguide having an electrically pumped gain region to emit said first light pulses,
at least one reflector structure to couple said first light pulses into a nonlinear crystal by changing the direction of said first light pulses by an angle which is in the range of 70 to 110 degrees, said reflector structure comprising a sub-wavelength grating structure to change the polarization of said first light pulses, and
the nonlinear crystal to generate second light pulses such that the optical frequency of said second light pulses is two times the optical frequency of said first light pulses.

According to a second aspect of the invention, there is provided a method of generating light pulses by using an array of light emitters, each light emitter comprising a saturable absorber and a waveguide having an electrically pumped gain region, said method comprising:
providing first light pulses by using a saturable absorber and a waveguide,
changing the direction of said first light pulses by an angle which is in the range of 70 to 110 degrees by using a reflector structure,
changing the polarization of said first light pulses by using a sub-wavelength grating structure, and
coupling said first light pulses into a nonlinear crystal in order to generate second light pulses such that the optical frequency of said second light pulses is two times the optical frequency of said first light pulses.

According to a third aspect of the invention, there is provided a projecting device comprising projecting optics and a light-emitting device, said light-emitting device comprising:
an array of light emitters to emit first light pulses, each of said light emitters in turn comprising a saturable absorber and a waveguide having an electrically pumped gain region to emit said first light pulses,
at least one reflector structure to couple said first light pulses into a nonlinear crystal by changing the direction of said first light pulses by an angle which is in the range of 70 to 110 degrees, said reflector structure comprising at least one sub-wavelength grating structure to change the polarization of said first light pulses, and
the nonlinear crystal to generate second light pulses such that the optical frequency of said second light pulses is two times the optical frequency of said first light pulses.

Periodical poling of nonlinear crystals may be easier for TM-polarized light than for TE-polarized light. However, laser light emitters tend to emit TE-polarized light e.g. due to compressive strain in the gain regions. The orientation of the poled zones of the nonlinear crystal may be matched with the polarization of light pulses coupled into said crystal by changing the polarization state of the light pulses. Thanks to the polarization-changing reflector structure, the polarization of light pulses provided by several light emitters may be simultaneously matched with the orientation of the periodically poled zones in a common nonlinear crystal. Thus, the conversion efficiency in the crystal may be substantially increased while preserving technical simplicity and stable construction.

Thanks to the gain regions implemented in the waveguides, the polarization stability of the light emitters is better when compared with vertical cavity surface-emitting laser (VCSEL) arrangements of prior art. The polarization stability allows effective use of a periodically poled nonlinear crystal.

Thanks to the reflector structure, the operation of light emitters may be tested already on a wafer, before the emitters are separated from the wafer.

Thanks to the reflector structure, the nonlinear crystal may be aligned easily with respect to the paths of the light pulses.

In an embodiment, the gain region, the saturable absorber, the inclined reflecting structure and the nonlinear crystal are attached on a common substrate, which provides a stable structure.

Solid-gas interfaces may cause adverse reflections in the optical cavity. These reflections may be minimized e.g. by antireflection coatings. However, implementing of an antireflection coating directly on the end of the gain region may be problematic due to the small size of the coated area and said coating may be even impossible to implement in wafer-scale processing. In an embodiment, the antireflection coating may be implemented on the surface of the substrate instead of a cleaved edge of an emitter, thanks to the inclined reflecting structure.

The high peak intensity may also lead to catastrophic optical damage (COD) in a semiconductor facet. Thanks to the inclined reflecting structure, the optical power of the light pulses may be distributed over a larger area on the inclined reflector structure and over a larger area on the surface of the substrate, which results in a reduced intensity. Thus, a high intensity at a cleaved edge of an emitter may be avoided. The substrate may be selected to have a wider band gap than the edge of a conventional edge-emitting semiconductor laser, and consequently the substrate material may have a higher threshold intensity for catastrophic optical damage.

Thanks to the inclined reflecting structure, the optical surfaces may also be passivated in a wafer-level process, allowing low-cost mass-production.

In an embodiment, very short light pulses may be generated by a Q-switched arrangement where the nonlinear crystal comprises a Bragg grating to provide frequency-selective optical feedback to the gain region through said crystal. The feedback structure may stabilize the optical frequency of the generated light pulses. The reflectivity of the combination of the crystal and the grating may be substantially reduced at high intensity values, which may allow generation of light pulses by cavity dumping.

The light-emitting device is adapted to emit short light pulses at a high repetition rate. The duration of the pulses may be e.g. in the range of 500 fs to 1 ns. The repetition rate of the pulses may be e.g. in the order of 100 MHz to 100 GHz. The successive pulses have short coherence length and they are substantially non-coherent with each other. Consequently, the pulsed light creates a lower speckle contrast than light provided by a continuously operating laser. An image formed by coherent light typically creates annoying speckle patterns when viewed visually. The speckle contrast may be substantially reduced when the light source provides short light pulses at a high repetition rate.

Thanks to the short duration of the pulses, the pulses have a broad spectrum which further reduces speckle contrast.

The light-emitting device comprises a plurality of emitters adapted to emit light pulses substantially independently. Consequently, the speckle contrast may be substantially reduced when compared with single-emitter devices. The high speckle contrast is typically rather annoying to look at, and it reduces the quality of an projected image.

Thanks to the pulsed operation, the peak power may be substantially higher than the peak power of a continuously operating laser device, when the devices have the same average power. The peak optical power may be e.g. greater than 10 times the average optical power, or even greater than 100 times the average optical power. Consequently, the efficiency of second harmonic generation in a nonlinear crystal may be substantially increased. The frequency-doubling efficiency of the nonlinear crystal increases with the optical intensity, thus favoring short pulses with high peak power.

Thanks to the pulsed operation at a high repetition rate, the device consumes less electrical power than a continuously operating device providing the same optical power at the same visible wavelength. Consequently, the device may operate at a lower temperature and the operating reliability may be higher. Consequently, the weight and the size of the required cooling units may be reduced.

The energy of an individual light pulse may be selected to be so small that it does not cause damage in a human eye. The energy of an individual light pulse may be e.g. substantially smaller than 1 nJ. In an embodiment, the light-emitting device may be considered to provide substantially non-coherent light. Official regulations governing the use of a non-coherent light source may be less stringent in certain states.

The embodiments of the invention and their benefits will become more apparent to a person skilled in the art through the description and examples given herein below, and also through the appended claims.

BRIEF DESCRIPTION OF THE DRAWINGS

In the following examples, the embodiments of the invention will be described in more detail with reference to the appended drawings in which.

DETAILED DESCRIPTION

Figure 1A:
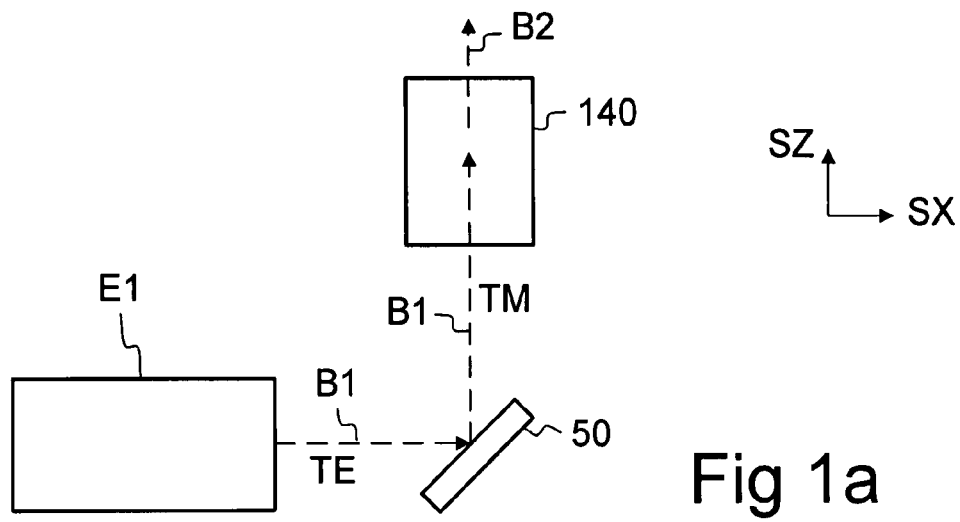
FIG. 1a shows, in a side view, changing of the polarization of light pulses.

Referring to FIG. 1a, a light emitter E1 is adapted to emit first light pulses B1 which impinge on an inclined reflector structure 50. A majority of the optical power provided by the light emitter E1 may be initially in the transverse electric TE mode. The polarization changing element 50 may be adapted to change the polarization of the first light pulses B1 so that the majority of the optical power is in the transverse magnetic TM mode after the interaction with the inclined reflector 50.

The inclined reflector 50 may be further adapted to reflect the first light pulses B1 and to change the direction of said first light pulses B1 so that they are coupled into a nonlinear crystal 140. The light pulses B1 are coupled into the nonlinear crystal 140 in order to provide second light pulses B2 having double optical frequency and half wavelength when compared with the light B1, i.e. to provide second harmonic generation (SHG). In other words, the nonlinear crystal 140 is adapted to generate second light such that the optical frequency of the light B2 provided by the nonlinear crystal is two times the optical frequency of the light B1.

The conversion efficiency may depend on the polarization. The nonlinear crystal 140 may be e.g. periodically poled and oriented with respect to the light pulses B1 such that maximum conversion efficiency is provided for the TM mode. The conversion efficiency means the efficiency of converting optical power at the fundamental frequency into optical power at the second harmonic frequency.

The direction SX is parallel to the initial direction of the first light pulses B1. The direction SZ is perpendicular to the direction SX. The inclined reflector 50 may direct the first light pulses in the direction SZ.

Figure 1B:
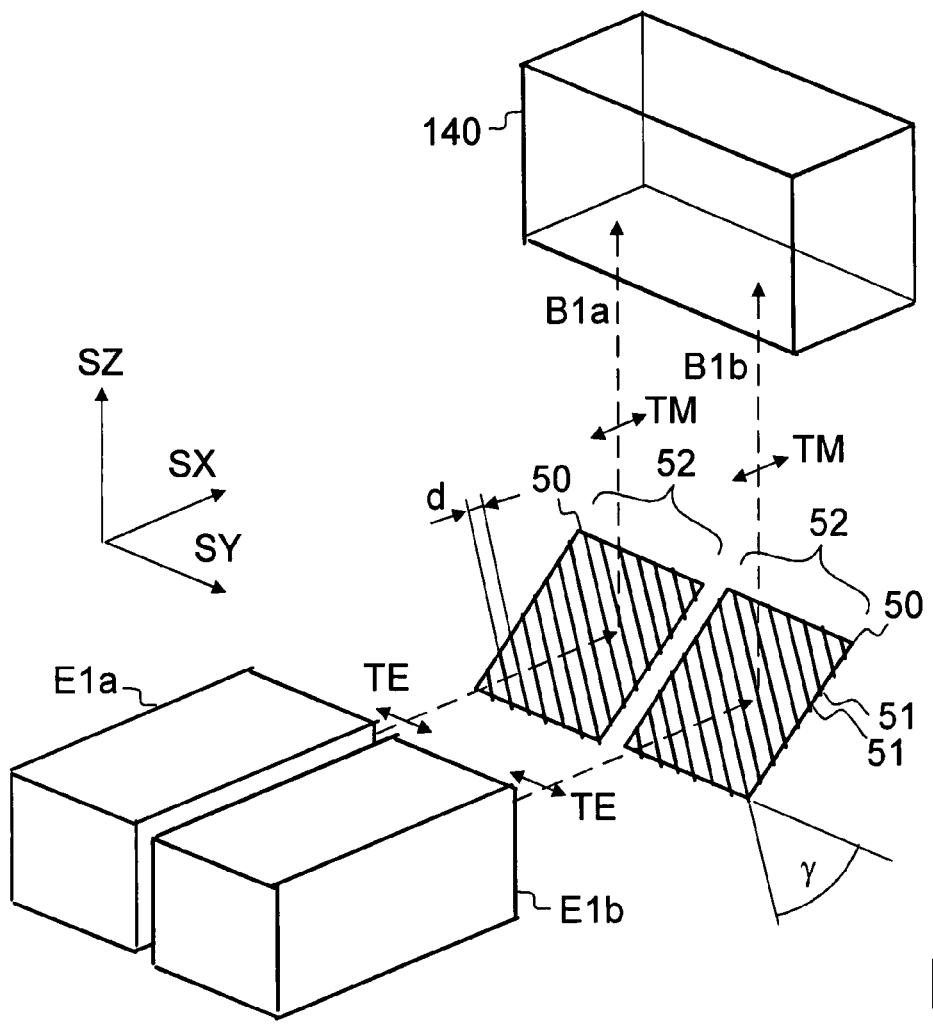
FIG. 1b shows, in a three-dimensional view, changing of the polarization of light pulses by using sub-wavelength grating structures.

Referring to FIG. 1b, the inclined reflectors 50 may comprise one or more sub-wavelength gratings structures 52 to rotate the polarization of light pulses B1a, B1b provided by adjacent emitters E1a, E1b. The light pulses B1a, B1b may be coupled to a common nonlinear crystal 140.

Sub-wavelength grating structures are described e.g. in an article "Comparison of metallic and dielectric sub-wavelength gratings in conical diffraction for polarization conversion", by K. Ventola, N. Passilly, P. Karvinen, P. Laakkonen, J. Turunen, and J. Tervo, to be published in Applied Optics, Optical Society of America. Said article was publicly available on the internet on 16 May 2007 via the www-pages http://ao.osa.org/upcoming.cfm.

The sub-wavelength grating structure is a diffractive grating structure which has so small grating period d with respect to the wavelength of the first light pulses B1 that all diffraction orders except the zeroth order are evanescent.

The sub-wavelength grating structures 52 have a plurality of adjacent diffractive features 51. The orientation of the diffractive features 51 may be defined by an angle $\gamma$ with respect to the direction SY. Referring to the above-mentioned article by Ventola et al., the grating period d, the orientation of the diffractive features 51, the form of the grating profile, the refractive indices of the materials of the grating, the protrusion height of the diffractive features, and the fill factor may be selected so that TE-polarized light may be substantially converted into TM-polarized light.

The direction SY is perpendicular to the directions SX and SZ.

A sub-wavelength grating structure 52, as such, may act as the inclined reflector 50, by diffracting light into the zeroth diffraction order.

Alternatively, the inclined reflector 50 may comprise one or more further reflective layers and/or further grating structures (not shown), in addition to a sub-wavelength grating structure 52. The further layer or structures may be superposed on the sub-wavelength grating structure or interlaced with regions of the sub-wavelength grating structure.

It should also be noted that the sub-wavelength gratings 52 may operate reciprocally, by converting the incident TE-polarized light from the gain region 20 into TM-polarized light entering the nonlinear crystal 140, and by converting reflected TM-polarized light from the Bragg grating 82 (FIGS. 3 and 4) back into TE-polarized light, providing polarization-matched wavelength-selective optical feedback to the gain region 20.

Figure 2A:
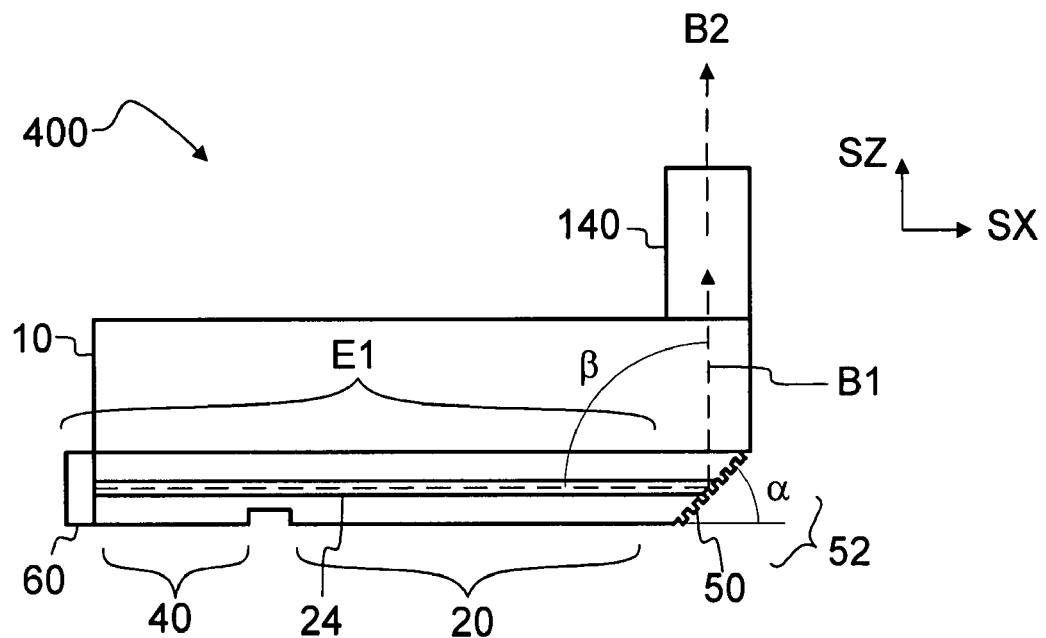
FIG. 2a shows, in a side view, a light-emitting device comprising a gain region, a saturable optical absorber, an inclined reflector structure, and a nonlinear crystal.

Referring to FIG. 2a, the light emitting device 400 comprises an array of light emitters E1 and a nonlinear crystal 140.

The light emitter E1 comprises a waveguide 24 having an electrically pumped gain region 20. The light emitter E1 comprises also a saturable absorber 40 and a back reflector 60. The combination of the saturable absorber 40 and the back reflector 60 is also known by the acronym SESAM (semiconductor saturable absorber mirror).

The gain region 20 and the saturable absorber 40 are adapted to provide first light pulses B1 which propagate in the waveguide 24 initially in the direction SX. The inclined reflector 50 is adapted to direct the light pulses B1 emitted from the waveguide 24 into the nonlinear crystal 140. The inclined reflector 50 is adapted to change the direction of the light pulses B1 by an angle $\beta$ which is in the range of 70 to 110 degrees. In particular, the angle $\beta$ may be substantially equal to 90 degrees.

The inclined reflector 50 is adapted to change the polarization of the first light pulses B1 so that the polarization of the first light pulses b1 coupled into the crystal 140 matches with the optimum orientation of the nonlinear medium of the crystal 140.

The gain region 20, the saturable absorber 40, and the inclined reflector 50 may be implemented on a common substrate 10. The nonlinear crystal 140 may be attached to the substrate 10 either directly or by a suitable spacer block. The implementation of the gain region, the saturable absorber, and the inclined reflecting structure on the common substrate provides considerable stability when compared with linear edge-emitting arrangements of prior art. The substrate 10 may be substantially transparent at the wavelength or wavelengths of the light pulses B1, in order to allow the light to pass vertically through said substrate 10. The light may be directed through the substrate 10 to the nonlinear crystal 140.

The inclined reflector structure 50 comprises the polarization-changing sub-wavelength grating structure. The sub-wavelength grating structure may be implemented e.g. by etching on the reflector 50. Alternatively, a separately manufactured sub-wavelength grating element may be attached to an inclined surface of the light emitting device 400.

The sub-wavelength grating structure may comprise an interface between a high refractive index material, e.g. gallium arsenide and a low refractive index medium, e.g. dielectric coating or air. The light pulses B1 may impinge on the sub-wavelength grating structure from the side of the high refractive index material.

The sub-wavelength grating may be implemented by using dielectrics or a metal, e.g. silver, gold or aluminium. However, the limit for catastrophic optical damage (COD) may be higher for a dielectric grating.

Figure 9:
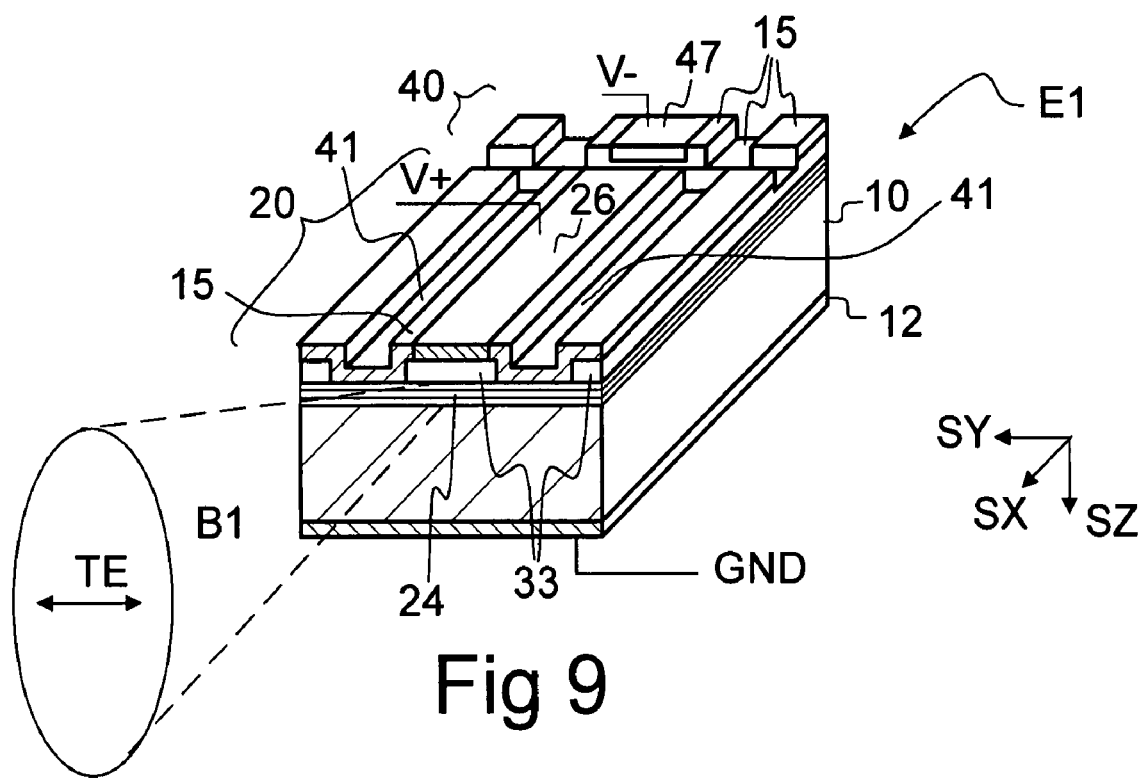

The waveguide 24 may be a ridge waveguide, i.e. it may have the form of a ridge (see FIG. 9). The waveguide 24 is substantially parallel to the horizontal direction SX. Light which propagates longitudinally, i.e. substantially in the direction SX in the waveguide 24 is confined to said waveguide by total internal reflections on the sides of the waveguide.

The inclined reflector 50 may be adapted to direct the light pulses B1 provided by the emitter E1 substantially in a vertical direction SZ. The angle $\alpha$ between the plane of the inclined reflector structure 50 and the direction SX may be in the range of 35-55 degrees. In particular, the angle $\alpha$ may be substantially 45 degrees. The angle between the plane of the sub-wavelength grating structure and the direction SX may also be equal to $\alpha$.

The back reflector 60 is adapted to reflect light emitted from an end of the gain region 20 through the saturable absorber 40 back into said gain region 20, i.e. in the direction SX. The back reflector 60 may be e.g. a Bragg grating, a multilayer dielectric coating, or a cleaved surface.

Thanks to the inclined reflector structure 50, the operation of the emitter E1 may be tested before it is separated from a wafer. Thus, any faulty emitters E1 may be identified before further processing, and cost savings may be expected.

Figure 2B:
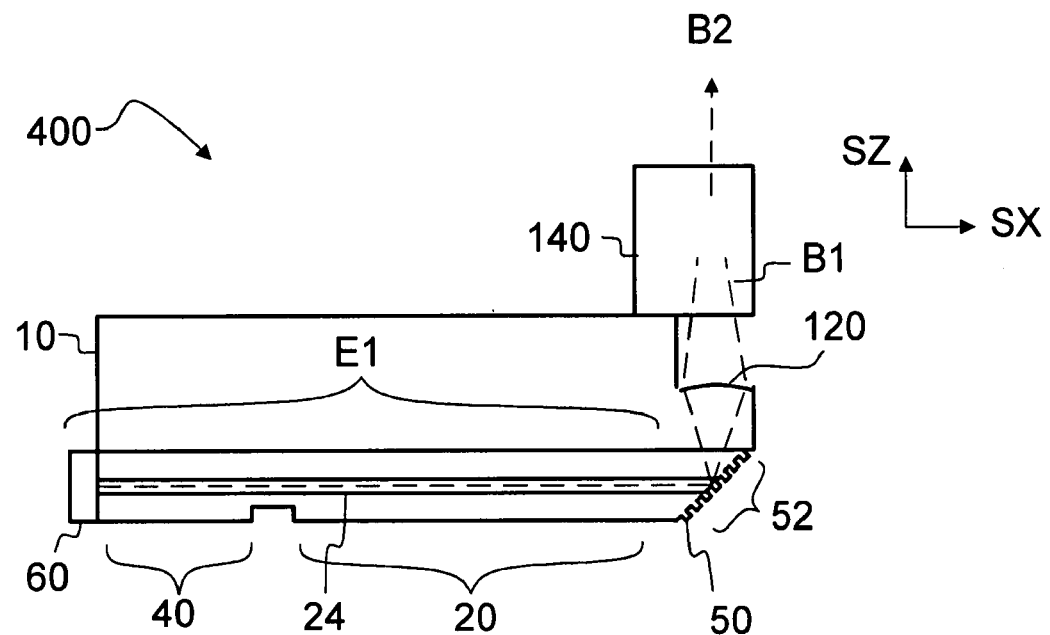
FIG. 2b shows, in a side view, a light-emitting device comprising a light-concentrating refractive surface to concentrate light into a nonlinear crystal.

Referring to FIG. 2b, the light emitting device 400 may comprise one or more light-concentrating structures 120 in order to concentrate the light pulses B1 into the nonlinear crystal 140. The light-concentrating structure 120 may focus or collimate light into the nonlinear crystal 140 in order to increase the conversion efficiency. Focusing of light may comprise also providing a nearly collimated beam. The width of the light beam B1 may be e.g. in the range of 30 to 50 µm at the position of the light-concentrating structure 120.

The light-concentrating structure 120 may be e.g. a cylindrical lens which is adapted to collimate or focus light B1 in the direction of the fast axis, which is in the direction SX. The fast axis of the light beam B1 propagating in the waveguide 24 is originally in the direction SZ, but after the reflection by the structure 50, the fast axis is in the direction SX.

The light concentrating structure 120 may be positioned between the substrate 10 and the nonlinear crystal 140. For example, a lens may be attached to the substrate 10 e.g. by optical cement. The lens 120 may also be etched or machined onto the substrate 10.

The same lens may also be adapted to collimate light B1 in the direction of the fast axis and in the direction of the slow axis. The lens 120 may e.g. have an ellipsoidal surface, or a first surface of the lens 120 may have a cylindrical curvature in the direction SZ and a second surface of the lens may have cylindrical curvature in the direction SY.

Figure 4:
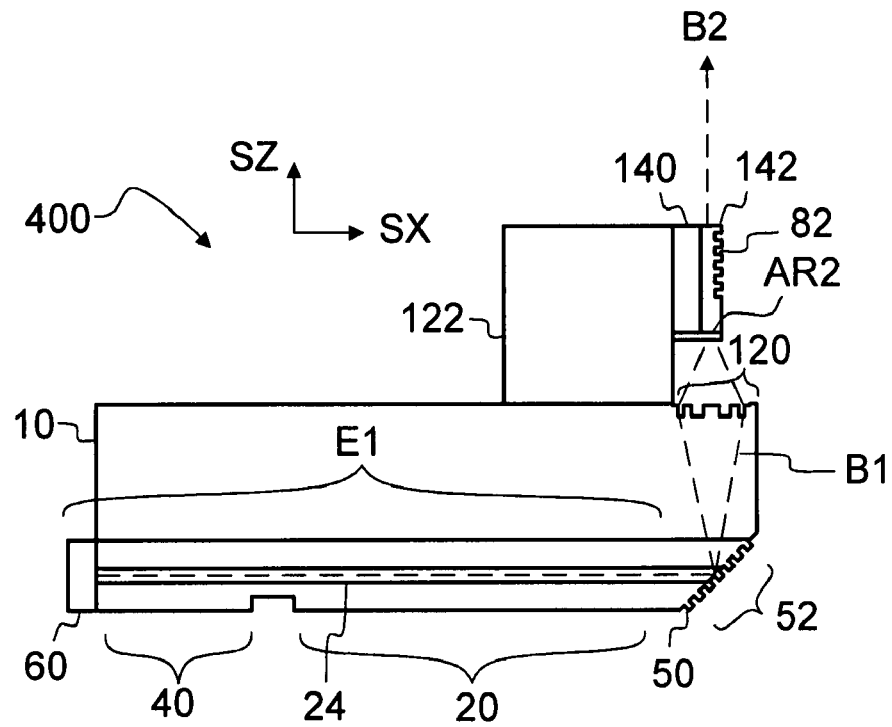
FIG. 4 shows, in a side view, a light-emitting device comprising a diffractive light-concentrating element.

The light-concentrating structure 120 may also be a diffractive lens (FIG. 4).

When the light-emitting device 400 does not comprise a high-Q optical cavity, such as in FIGS. 2a and 2b, it may provide light pulses B1 by gain switching or by the varying intensity-dependent loss in the saturable absorber 40, i.e. by a process which is similar to the Q-switching. The "Q" denotes the quality factor. The absorber 40 is initially in the absorbing state for low-intensity light. The gain in the gain region 20 is temporarily reduced after emission of a preceding light pulse. The intensity transmitted through the absorber 40 increases with increasing intensity of the incident light, until the intensity reaches the saturation level of the absorber 40. The reflectance of the combination of the back reflector 60 and the saturable absorber 40 is now suddenly increased, which leads to a drastic increase in the intensity of light amplified in the gain region 20. However, generation of the high intensity reduces the gain in the gain region 20 due to spectral hole-burning effect, which provides the falling edge of the pulse. The saturable absorber 40 may have sufficiently short carrier life-time to enable ultra-short pulses. The intensity is soon reduced below a level required to set the absorber into the absorbing state, and the cycle described above may repeat itself.

Figure 3:
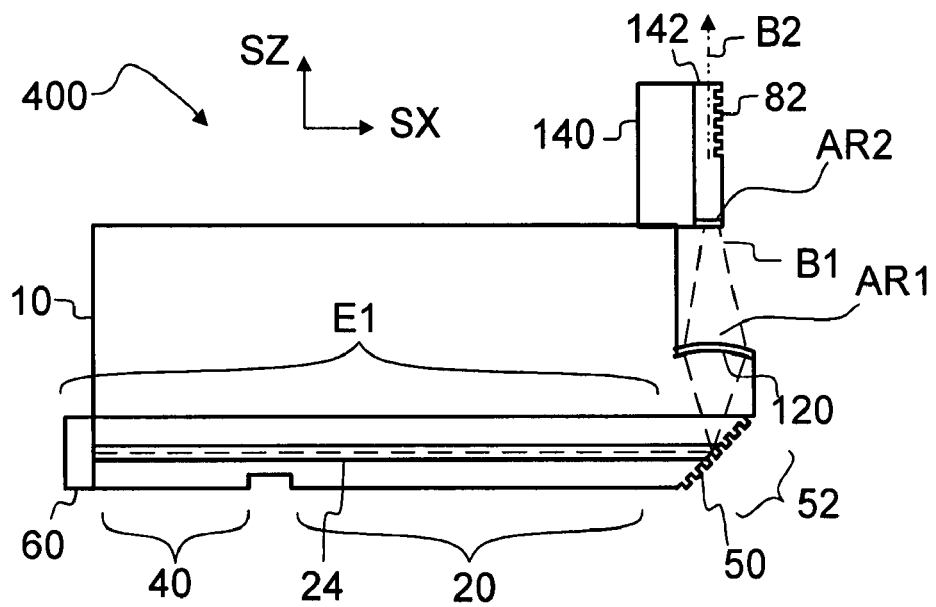
FIG. 3 shows, in a side view, a light-emitting device comprising a feedback structure to define a folded laser cavity.

Referring to FIGS. 3 and 4, the light emitting device 400 may further comprise a feedback structure 82 to define a folded optical cavity together with the back reflector 60. The optical cavity comprises the gain region 20 and the saturable absorber 40. The optical cavity, i.e. the optical resonator controls the properties of the light pulses B1 and/or enables wavelength-selective amplification of spontaneous emission. The feedback structure 82 may be frequency-selective to provide frequency-selective feedback at the frequency of the first light pulses B1, in order to stabilize the optical frequency of the first light pulses B1 to a predetermined value and to reduce the spectral bandwidth of the first light pulses B1 for improved second harmonic generation efficiency.

The crystal 140 may comprise waveguides 142 which comprise nonlinear medium. The waveguides 142 confine light and facilitate maintaining a high optical intensity for the light which interacts with the nonlinear medium.

The waveguide 142 may also comprise a cladding layer which has a lower refractive index than a core of said waveguide 142. The Bragg grating may be implemented on said cladding. The distance between the core of said waveguide and the diffractive features of the Bragg grating may be selected such that the reflectivity of the Bragg grating is substantially higher for the first light pulses B1 than for the second light pulses B2.

The speckle contrast may be minimized by reducing the duration of the light pulses provided the emitter E1. The use of short light pulses provides also a good efficiency of converting electrical energy into optical energy at visible wavelengths. In particular, very short light pulses may be provided when the emitted high-intensity pulses travel through the gain region 20 only once. This may be achieved by e.g. by cavity dumping. The Bragg grating 82 may be adapted to provide frequency-selective feedback at the predetermined frequency of the fundamental light pulses B1, i.e. at the wavelength of said light pulses B1. The Bragg grating 82 may allow stabilization of the fundamental frequency and generation of light pulses by cavity dumping. Optical feedback provided by the combination of the nonlinear crystal 140 and the Bragg grating 82 is substantially smaller for the high-intensity light pulses than for the low-intensity light. Thanks to the intensity-dependent feedback, the fall time of the generated pulses may be very short. Consequently, very short and intense light pulses of visible light may be generated at a high efficiency.

The saturable absorber 40, the gain region 20, and the nonlinear crystal are located optically between the back reflector 60 and the Bragg grating 82. The saturable absorber 40 and the gain region 20 are adapted to emit the first light pulses B1 which are coupled into said nonlinear crystal to generate the second light pulses B2. The gain region 20 emits also low-intensity light by amplified spontaneous emission such that said low-intensity light has a substantially lower intensity than said first light pulses. The low-intensity light is coupled through said nonlinear crystal to said Bragg grating 82 such that the grating 82 is adapted to diffract light frequency-selectively back into the gain region 20 in order to stabilize the optical frequency of said first light pulses B1 and to provide a narrow-frequency seed signal for the said first light pulses B1.

The reflectivity of the combination of the Bragg grating 82 and the nonlinear crystal 140 may be high at low intensity values and at the fundamental frequency, which amplifies light at the fundamental frequency. At higher intensities, the energy of the light pulses B1 at the fundamental frequency may be converted in a single-pass process into the energy of the light pulses B2 at the second harmonic frequency. The single-pass conversion efficiency may be even greater than 80% in a waveguide 142 which comprises nonlinear medium. Conversion of fundamental light B1 into second harmonic light B2 at high intensities reduces the reflectivity of the combination of the Bragg grating 82 and the nonlinear crystal 140 and causes cavity dumping.

The feedback structure may be e.g. a volume Bragg grating in the nonlinear crystal 140 or a surface relief Bragg grating implemented on the side of a waveguide 142. The dispersion of the waveguide 142 and the grating period of the grating 82 may be selected such that the reflectivity of said Bragg grating 82 is substantially higher at the optical frequency of the first light pulses B1 than at the optical frequency of the second light pulses B2. In other words, the Bragg grating may be substantially transmitting for the second light pulses B2.

It should be noticed that the Bragg grating and the periodically poled zones expand by the same relative amount when the nonlinear crystal 140 expands due to thermal expansion. Thus, the feedback frequency is always matched with the period of the poled regions, despite variations in the temperature of the crystal 140. This wavelength matching of the Bragg grating and the periodically poled zones combined with the wide gain spectrum of the gain region 20 results in substantial advantage in terms of relaxed operating temperature tolerances, and a sufficient frequency doubling efficiency may be maintained in a wide temperature range.

Unwanted reflections from solid-gas interfaces may be further reduced by implementing antireflection coatings AR1, AR2. An advantage gained by using the inclined reflector 50 is that an antireflection coating AR1 may be applied in a low-cost wafer level process, when compared to an antireflection coating on the cleaved end of the waveguide 24 of the emitter E1.

Referring to FIG. 4, the light-concentrating structure 120 may also be a diffractive structure implemented e.g. by etching, embossing or molding.

The nonlinear crystal 140 may be attached to the substrate 10 by using a spacer 122.

Figure 5:
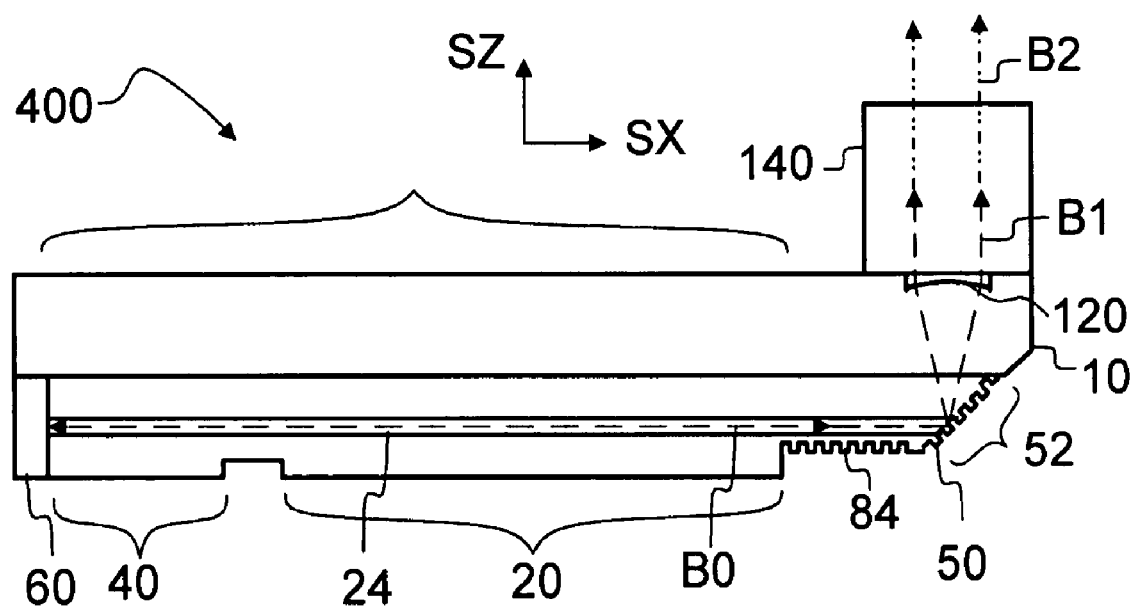
FIG. 5 shows, in a side view, a light-emitting device comprising a feedback structure to define a laser cavity.

Referring to FIG. 5, a feedback structure 84 may also be positioned optically between the gain region 20 and the nonlinear crystal 140 so that the feedback structure 84 and the back reflector 60 define together an optical cavity comprising the gain region 20 and the saturable absorber 40. The feedback structure 84 may be e.g. a Bragg grating.

Also the surface of a lens 120 may be adapted to act as a feedback structure. A dielectric coating may be applied to the surface to enhance reflection.

The intra-cavity beam B0 shown in FIG. 5 may have a substantially greater intensity than the beam B1 transmitted via the feedback structure 84.

Referring to FIGS. 3 to 5, the saturable absorber 40 may be reverse biased. Saturable absorption in the saturable absorber may cause the emitted light beam B1 to pulsate at a frequency which may be, to the first approximation, inversely proportional to the optical length of the cavity.

When the light-emitting device 400 comprises an optical cavity, it may provide light pulses B1 by gain switching, by active mode-locking, by passive mode locking, by active Q-switching, by passive Q-switching, and/or by semi-passive Q-switching.

The device 400 may be set to Q-switched operation e.g. by selecting the reverse bias voltage of the saturable absorber 40 high enough, by selecting the optical length of the saturable absorber 40, by selecting the saturable optical absorption in the saturable absorber to be high enough, and/or by selecting the reflectivity of the feedback structure 82, 84 and/or the back reflector 60 to be low enough.

In passive Q-switching, the bias voltage of the saturable absorber 40 is kept at a substantially constant level. In active Q-switching the optical loss in the saturable absorber 40 is modulated by modulating the bias voltage of the saturable absorber 40. Semi-passive Q-switching means that the bias voltage of the saturable absorber 40 is modulated in order to turn the laser on or off, but the a sequence of individual pulses is generated by passive Q-switching.

The pulse repetition rate may be e.g. in the range of 100 MHz to 100 GHz. In particular, the pulse repetition rate may be in the range of 1 GHz to 50 GHz. The duration of the pulses may be in the order of 500 femtoseconds to 1 nanosecond (500 fs to 1 ns), while the energy of an individual light pulse may be kept smaller than 1 nJ (nanoJoule). In particular, the duration of the pulses may be in the range of 1 ps to 10 ps. Consequently, the peak power of an individual light pulse emitted from a single emitter E1 may be e.g. in the range of 0.5 W to 50 W.

The speed of the saturable absorber 40 and the gain region 20 determine the minimum duration of a light pulse. In addition, the photon lifetime in the laser cavity has an effect on the pulse properties. For efficient frequency doubling, the light pulses should have a high intensity which may be achieved by short, high intensity pulses. The shorter the pulse width, the wider the pulse spectrum, and/or the higher the pulse repetition rate, the lower is the speckle contrast perceived by a human eye. Especially in case of passive Q-switching, the phase of individual light pulses is substantially random, resulting in random interference between the pulses.

The integration time of the human eye is typically in the range of 10 ms. If the pulse repetition rate of a single emitter is e.g. 10 GHz, the human eye may receive up to 10 million speckle patterns formed by short coherence length pulses per the integration period of 10 ms. By further reducing the pulse width, by increasing the pulse repetition rate, and by using a plurality of independent emitters, the number of received speckle patterns may be even greater than $10^9$ per 10 ms with a substantially reduced speckle contrast. The lowest speckle contrast may thus be achieved with large number of independent emitters providing pulses with a short coherence length at a high repetition rate.

A reduction in the duration of the pulse may also lead to an increase in the peak intensity, and consequently to a greater efficiency of converting electrical energy into the energy of visible light.

The recovery time of the saturable absorber 40 may be reduced e.g. by increasing the reverse bias voltage of the saturable absorber 40 or by introducing defects to the crystal by e.g. ion implantation.

The light-emitting device 400 may further comprise a phase shift region between the back reflector 60 and the feedback structure 82, 84 (not shown).

Figure 6A:
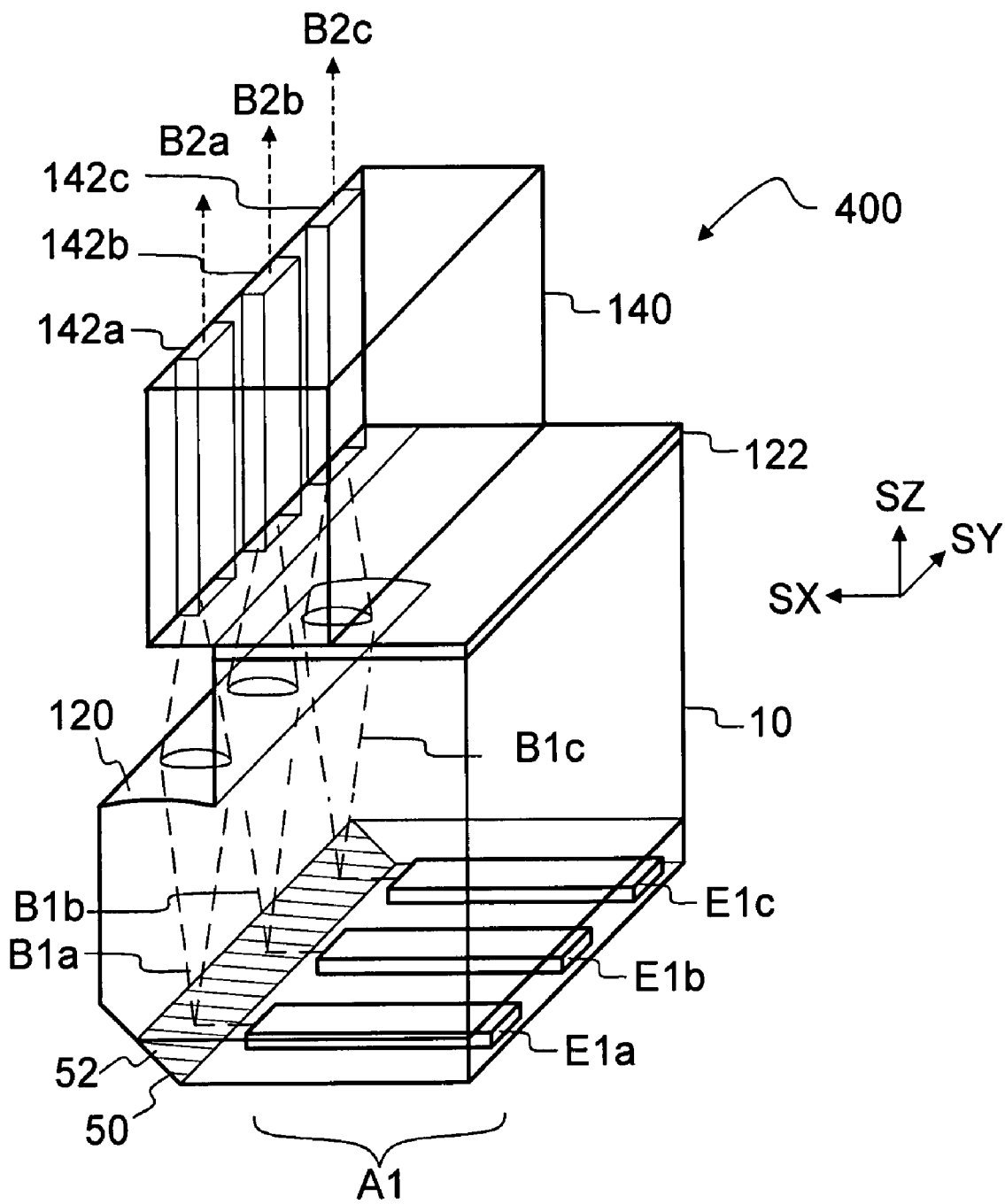
FIG. 6a shows, in a three-dimensional view, a light-emitting device comprising an array of adjacent light emitters, an inclined reflector structure, and a light concentrating structure to collimate or focus light into the nonlinear crystal.

Referring to FIG. 6*a*, the light emitting device 400 comprises an array A1 of emitters E1*a*, E1*b*, E1*c* to emit first light pulses B1*a*, B1*b*, B1*c*. The waveguides 24 of the emitters E1*a*, E1*b*, E1*c* are substantially parallel to each other. The array A1 may comprise two or more emitters E1 as described above with reference to FIGS. 2*a* to 5. The emitters E1*a*, E1*b*, E1*c* may be implemented substantially simultaneously on the common substrate 10 by using known semiconductor processing technologies.

The number of the emitters in the array A1 may be e.g. in the range of 2 to 5. The number of the emitters may also be in the range of 6 to 50 in order to provide high power and/or low speckle contrast. The number of the emitters may even be in the range of 51 to 2000 to implement a very low speckle contrast and a high luminous flux.

The distance between the centerlines of the emitters may be e.g. in the order of 25-100 μm. A 2.5 mm wide array A1 may comprise e.g. 25 to 100 individual emitters E1*a*, E1*b*, E1*c*, respectively. The centerlines may be substantially in the same plane.

The light provided by the emitters E1*a*, E1*b*, E1*c* of the array A1 may be reflected by a common reflector 50 and collimated or focused by a common light-concentrating feature 120 into a common nonlinear crystal 140. The light-concentrating feature 120 may be a diffractive lens or a refractive lens arranged to collimate or focus light into the nonlinear crystal 140.

The nonlinear crystal 140 may comprise one or more waveguides 142*a*, 142*b*, 142*c* to confine the in-coupled light. Said waveguides 142*a*, 142*b*, 142*c* comprise nonlinear medium. The purpose of said waveguides is to preserve a high intensity along the length of the crystal, i.e. in the vertical direction SZ, for more efficient single-pass frequency doubling.

The waveguides 142*a*, 142*b*, 142 may be implemented on the side of the nonlinear crystal 140 e.g. by annealed-protonexchange (APE) or by diffusion, e.g. by zinc or titanium diffusion, and/or by etching ridge waveguides.

A plurality of adjacent parallel waveguides 142a, 142b, 142c may provide a plurality of adjacent frequency-doubled light beams B2a, B2c, B2c, etc.

The nonlinear crystal 140 may be attached to the substrate 10 by a spacer 122. The position of the crystal may be set e.g. by selecting the thickness of the spacer 122.

Figure 6B:
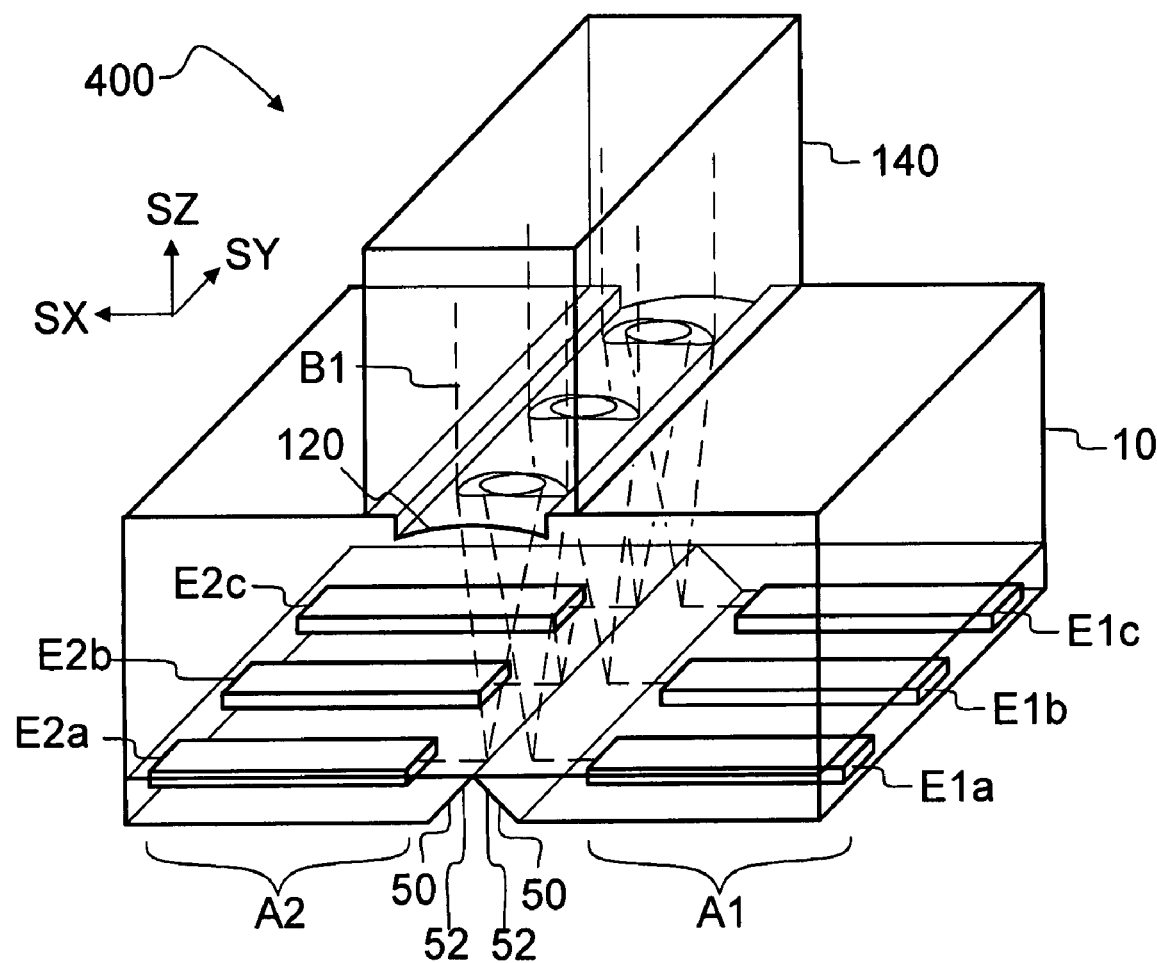
FIG. 6b shows, in a three-dimensional view, a light-emitting device comprising two opposite arrays of adjacent light emitters.

Referring to FIG. 6b, the light emitting device 400 may comprise two opposite arrays A1, A2 of emitters E1a, E1b, E1c, E2a, E2b, E2c to provide light pulses B1 into a common nonlinear crystal 140.

The light-emitting devices 400 shown in FIGS. 1-6b have one or more inclined reflectors 50 comprising one or more sub-wavelengths structures 52.

Figure 7:
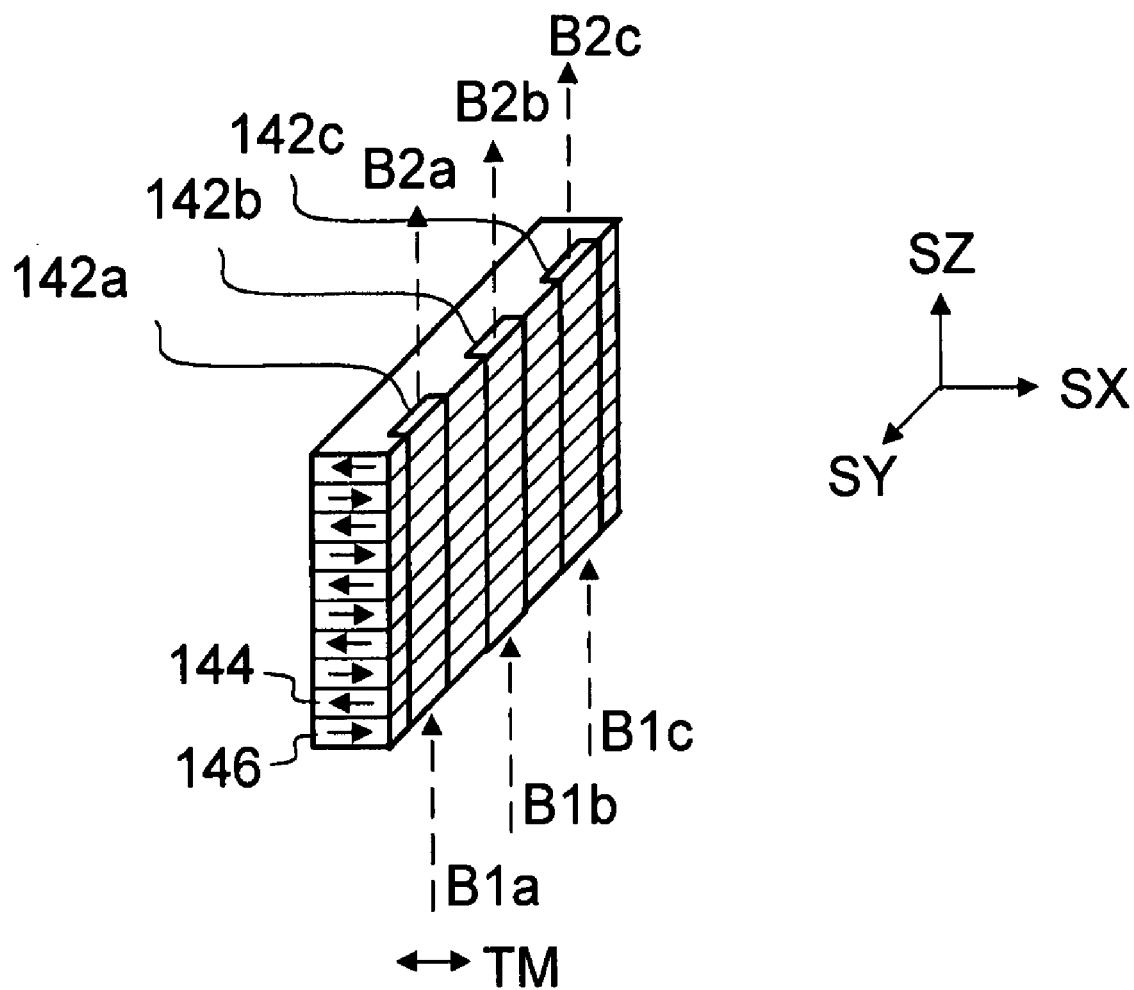
FIG. 7 shows, in a three-dimensional view, a periodically poled nonlinear crystal for TM-polarized light.

Referring to FIG. 7, the nonlinear crystal 140 may be periodically poled in the direction SX, i.e. substantially perpendicular to the surface of the nonlinear crystal 140, in order to provide quasi-phase-matching conditions. Said surface may be substantially parallel to a SY-SZ-plane defined by the adjacent paths of the light pulses B1a, B1b, B1c. The crystal 140 may comprise ferroelectric material poled by a spatially periodic electric field. Consequently, the nonlinear crystal 140 may comprise regularly spaced poled domains 144, 146 whose direction is matched with the electric field of the second harmonic beam B2a, B2b, B2c. The quasi-phase-matching grating may also be chirped or patterned in order to compress and/or to modify the shape of the light pulses and/or to allow a wider wavelength tolerance. The in-coming light pulses B1a, B1b, B1c may be TM-polarized, i.e. the electric field of the incoming laser beam may be substantially parallel to the direction SX.

The period of the poled domains is selected in such a way that the phase of the generated second harmonic beam B2 is matched with the fundamental light B1 in each poling period. Said selection is based on the dispersion of the nonlinear crystal, i.e. on the difference between the refractive index of the fundamental light B1 and the second harmonic light B2.

A periodically poled nonlinear crystal 140 may have one or more waveguides 142, 142a, 142b, 142c.

A single nonlinear crystal 140 may have several periodically poled zones whose periods are optimized for several different fundamental frequencies. Thus, a single nonlinear crystal 140 may be adapted to provide e.g. red, green and blue light.

The nonlinear crystal 140 or nonlinear medium may be e.g. lithium niobate, lithium tantalite, or potassium titanyl phosphate (KTiOPO4) which is also known as the KTP, periodically poled KTP, periodically poled lithium niobate (PPLN), lithium triborate (LBO). In particular, the nonlinear crystal 140 may be periodically poled magnesium oxide-doped lithium niobate (PP-MGO-LN).

Referring to FIGS. 3, 4, 6a, 6b, 7, the nonlinear crystal 140 may comprise:
  a waveguide 142a, 142b, 142c to confine light,
  a Bragg grating to provide frequency-selective feedback through nonlinear medium, and
  periodically poled zones 144, 146.

However, the nonlinear crystal 140 may also be without a waveguide.

The light-emitting device 400 may comprise one or more nonlinear crystals 140.

Figure 8A:
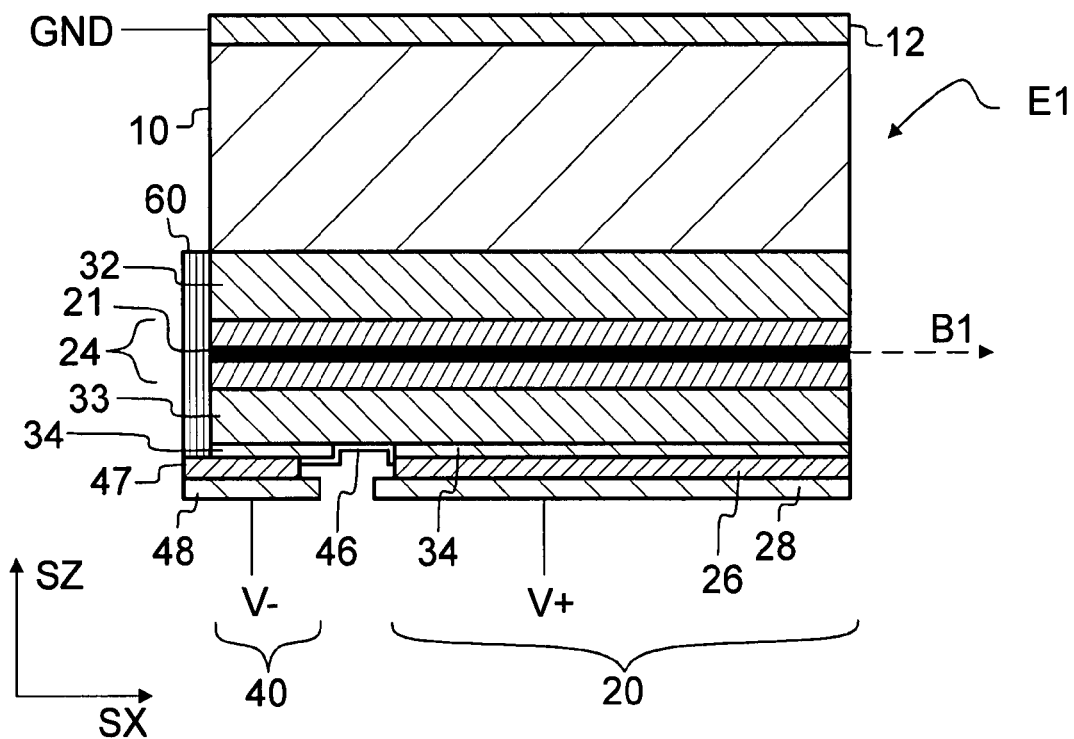
FIG. 8a shows, in a cross-sectional side view, structural elements of a light emitter.

FIG. 8a shows, by way of example, structural layers of an edge-emitting laser emitter E1. The waveguide 24 comprises at least one active region 21, e.g. one or more quantum wells or quantum dot layers. In particular, the active region 21 may comprise three quantum wells.

The waveguide 24 is substantially parallel to the structural layers of the active region 21, and the light beam B1 propagates along said active region. For comparison, a light beam provided by a vertical cavity surface-emitting laser (VCSEL) is typically substantially perpendicular to structural layers of said VCSEL. An advantage gained by using the edge-emitting configuration is the substantially higher single-pass gain. The amount of saturable absorption may also be selected by selecting the length of the saturable absorber 40 without the implementation of further structural layers. Consequently, the saturable absorber 40 may be adapted to provide a high saturable absorption without increased manufacturing costs.

The common substrate 10 may be of a substantially transparent semiconductor material, e.g. gallium arsenide (GaAs) or indium phosphide (InP).

The refractive indices of the substrate 10 and/or the waveguide may be substantially in the range of 3 to 4.

The waveguide 24 is located between cladding layers 32, 33. The substrate side cladding 32 may be n-doped and the second cladding 33 may be p-doped. A contact layer 34 is grown on the p-doped cladding. The gain region 20 and the saturable absorber have separate metallic contacts 26, 47. The laser chip, i.e. the emitter E1 may be attached to an insulated patterned sub-mount with e.g. Au/AuSn solder pads 48, 28.

The upper side of the common substrate 10 may be coated with a metallic contact layer 12. The back-reflector 60 may be implemented by optical multilayer coatings.

The waveguide 24 is substantially parallel to the common substrate 10. The waveguide 24 comprises the gain region 20 and the saturable absorber 40.

The layers 48, 28 may be in contact with an electrically insulating sub-mount (not shown) in order to cool the device 400. The sub-mount may also be electrically conducting if the saturable absorber 40 has a contact pad 28 which is electrically insulated from the sub-mount. The sub-mount may be made of e.g. beryllium oxide, aluminium nitride, silicon carbide, or diamond. The layers 48 and 28 may be pre-deposited on said sub-mount. The sub-mount may be in contact with a heat sink (not shown) in order to cool the device 400.

Alternatively, the layer 12 may be in contact with a sub-mount. However, the cooling is less effective than in case of cooling through the layers 28, 48, due to the higher thermal resistance through the common substrate 10

The gain region 20 is electrically pumped. A positive bias voltage V+ may be coupled to the gain region 20, and a negative bias voltage V− may be coupled to the saturable absorber 40, with respect to the ground GND. In other words, the gain region 20 if forward biased, and the saturable absorber 40 is reverse-biased.

There may be an electrical insulator 46 between the saturable absorber 40 and the gain region 20. The insulator may be e.g. a layer of silicon dioxide $SiO_2$. The highly doped contact layer 34 may be locally etched away from below the insulator 46 such that the resistance between the gain region 20 and the saturable absorber 40 may be higher than e.g. 1 kΩ. The resistance between the gain region 20 and the saturable absorber 40 may be increased e.g. by ion implantation. The highly doped contact layer 34 may extend below the insulator 46 in order to maximize the effective length of the saturable absorber 40, by distributing electrical current also in the horizontal direction, while still providing a sufficient separation of the two metal contacts 26, 47 in order to facilitate packaging.

Figure 8B:
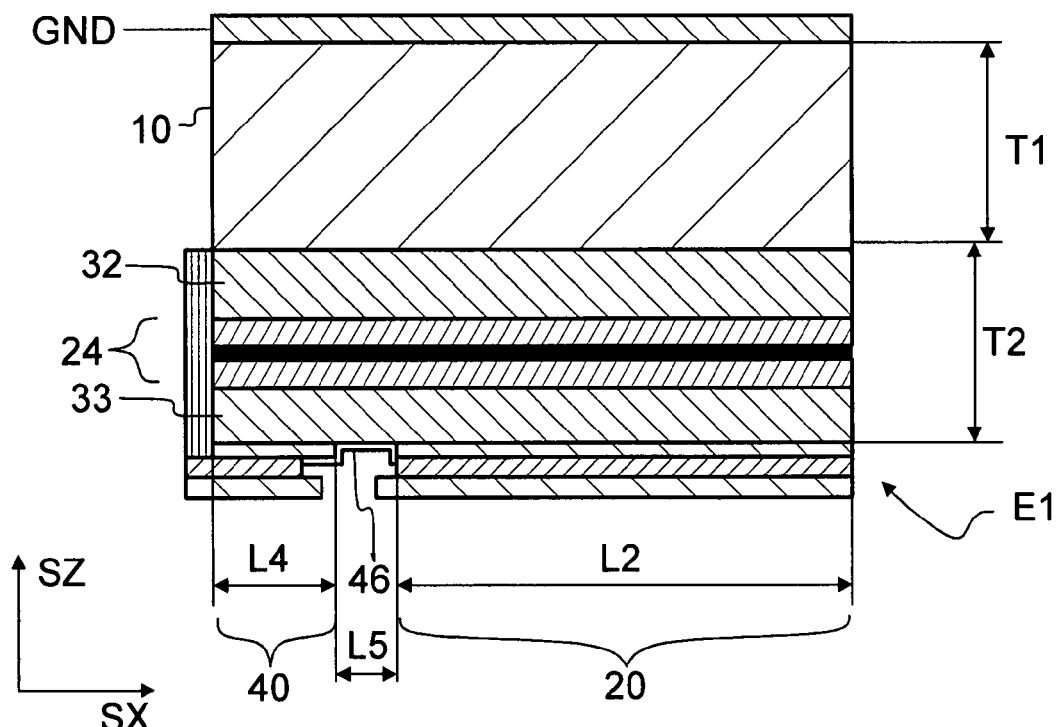
FIG. 8b shows, in a cross-sectional side view, dimensions related to FIG. 8a, FIG. 9 shows, in a three-dimensional view, a light emitter having a ridge waveguide.

FIG. 8b shows some dimensions associated with the structure of FIG. 8a. The total thickness T2 of the waveguide and the cladding layers 32, 33 may be e.g. in the range of 3 to 4 μm. The thickness of the common substrate 10 may be e.g. in the range of 80 to 150 µm. The length L5 of the insulating zone between the saturable absorber 40 and the gain region 20 may be e.g. in the range of 5 to 50 µm. The length L2 of the gain region 20 may be e.g. in the range of 250 to 4000 µm. The length L4 of the saturable absorber may be e.g. in the range of 10 to 200 µm.

Referring to FIG. 9, the laser emitter E1 may comprise a ridge waveguide 24. The waveguide 24 comprises the gain region 20, and it may further comprise the saturable absorber 40. The gain region 20 and the saturable absorber 40 may be implemented on the common substrate 10.

The electric field in the gain region 20 is substantially oriented in the direction SZ. Said electric field is caused by the bias voltage V+. Properties of the gain region 20 determine the polarization of the light pulses B1 propagating in the waveguide 24.

The gain region 20 may be compressively strained such that the majority of optical power of the generated light pulses B1 is in the TE-polarized mode.

Edge-emitting lasers with a lattice-mismatched gain region 20 have a stable polarization determined by the device asymmetry and the strain of the gain region 20. The stable polarization allow effective use of a periodically poled nonlinear crystal. For comparison, vertical cavity surface emitting lasers have typically an unstable polarization due to high device symmetry.

A laser array A1 may comprise several parallel ridge waveguides 24 according to FIG. 9. Contact layers 26, 47 of adjacent emitters E1 may be attached to a common heat sink. The light-emitting device 400 may have trenches 41 which are etched into the cladding layer 33 in order to define a ridge waveguide 24. The cladding 33 and the trenches may be coated with electrically insulating layers 15. The insulating layer 15 may be locally removed and the electrical contacts 26, 47 may be implemented on the exposed cladding 33 over the central portions of the ridge waveguide 24.

The waveguide 24 may also have a tapered form in order to reduce the divergence of the emitted light beam B1 in the direction of slow axis.

Figure 10:
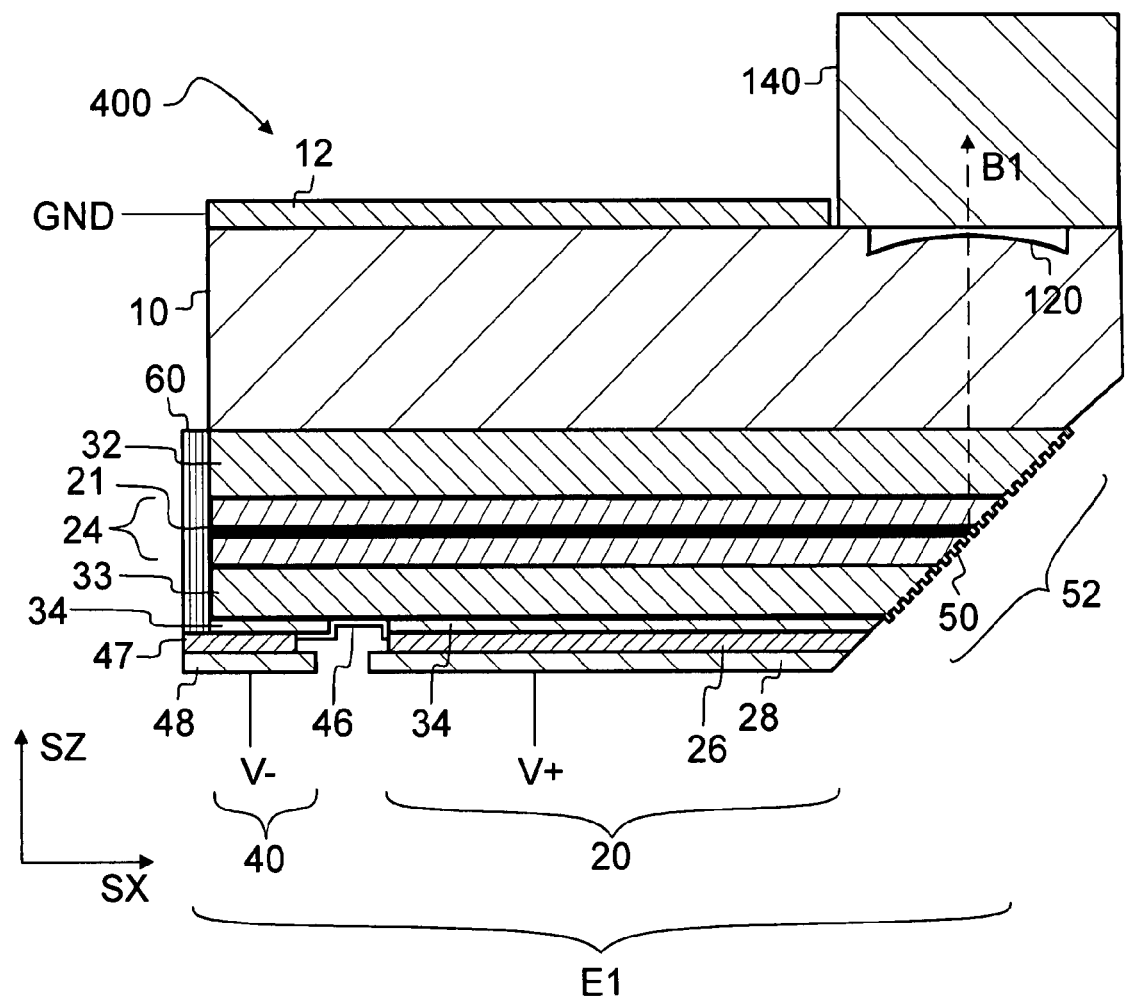
FIG. 10 shows, in a cross-sectional side view, structural elements of a light emitter comprising an inclined sub-wavelength grating.

Referring to FIG. 10, the inclined reflector structure 50 may be implemented e.g. by etching a surface relief subwavelength grating structure 52 onto an inclined surface. The inclined reflector structure 50 may be left uncovered or it may be covered with a protective layer, e.g. silicon nitride $Si_3N_4$ or silicon dioxide $SiO_2$ (not shown). The dielectric layer 92 may be further protected by a further metal layer, e.g. by a layer of gold (not shown). The refractive index of the protective layers may be taken into consideration when selecting the grating period, profile height, profile form and fill factor of the sub-wavelength grating.

An advantage associated with the inclined reflector 50 of FIG. 10 is that a high intensity at the output surface of the light emitter E1 may be avoided due to beam divergence in the substrate 10. The reduction in the intensity decreases the risk of catastrophic optical damage (COD) at the output interface. The inclined reflector 50 may also be cooled by a further metallic layer to the sub-mount (not shown), which further reduces the risk of COD. The inclined reflector 50 allows the integration of the light concentrating structure 120 into the substrate 10 for efficient coupling of the light pulses B1 into the nonlinear crystal 140.

It should be noticed that the structure may be implemented without any solid-gas interfaces between the gain region 20 and the surface of the substrate 10.

A portion 120 of the surface of the common substrate 10 may have a substantially cylindrical form to collimate or focus the beam B1 into the nonlinear crystal 140.

The other structural layers shown in FIG. 10 were described above with reference to FIGS. 8a, 8b and 9.

The inclined reflector 50 may comprise a further diffractive grating pattern in order to reflect a part of the light beam B1 back into the waveguide 24, in addition to reflecting a part of the light beam into the nonlinear crystal 140. Thus, the inclined reflector 50 may also act as a feedback structure which defines an optical cavity together with the back reflector 60.

The emitters of the light emitting device 400 may be operated in a passive Q-switched, active Q-switched, or semi-passive Q-switched mode. In all these modes the gain region 20 may be driven with a substantially constant current in order to provide a substantially stable maximum population inversion in the gain region 20. The current in the gain region 20 may be selected to be high in order to provide high single-pass gain.

In the passive Q-switched mode the bias voltage of the saturable absorber 40 is kept at a substantially constant negative level during the generation of the light pulses B1. The light pulses B1 are generated as the saturable absorber 40 is rapidly switched between the absorbing state and the non-absorbing state by the varying optical intensity. The absorber 40 is initially in the absorbing state for low-intensity light. The gain in the gain region 20 is temporarily depleted after emission of a preceding light pulse. The intensity transmitted through the absorber increases with the increasing intensity of the incident light, until the intensity reaches the saturation level of the absorber 40. The cavity losses are now suddenly reduced leading to a drastic increase in the intensity of an emitted pulse. However, generation of the light pulse reduces temporarily also the population inversion due to the spectral hole-burning effect, which provides the falling edge of the pulse. The intensity is soon reduced below a level required to set the absorber into the absorbing state, and the cycle described above may repeat itself without active modulation of the bias voltage of the absorber 40. The duration of an individual light pulse may be e.g. in the range of 500 fs to 1 ns, and the temporal separation between subsequent pulses may be e.g. in the range of 10 ps to 10 ns.

FIGS. 11a-11e show, by way of example, how the gain region 20 and the saturable absorber 40 may operate together to provide short light pulses B1.

Figure 11A:
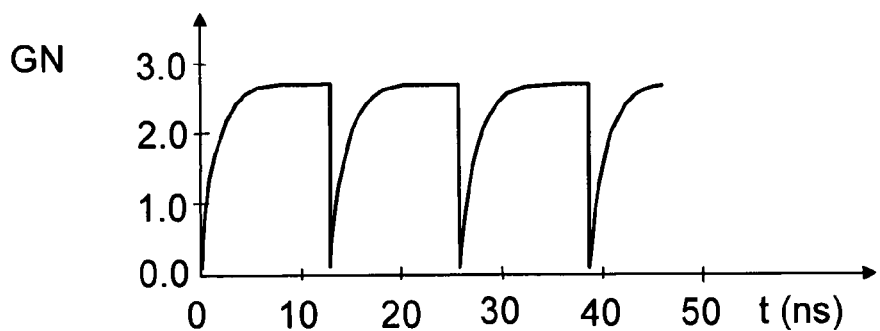
FIG. 11a shows temporal evolution of gain provided by the gain region of an emitter.

FIG. 11a shows the temporal evolution of gain GN provided by the gain region 20. The abscissa values t show the time in nanoseconds and the ordinate values show the gain GN in logarithmic scale, in arbitrary units. The gain region 20 is electrically pumped. The gain begins to increase after the start of the pumping or after a previous light pulse has been launched. The gain increases and may reach a saturation value. However, launching of a light pulse temporarily depletes the gain region 20. In particular, generation of a light pulse B1 is associated with avalanche-type recombination of stimulated emission, which results in spectral hole-burning near the emission wavelength and finally spatial hole-burning along the gain region 20. The gain recovers after each pulse.

Figure 11B:
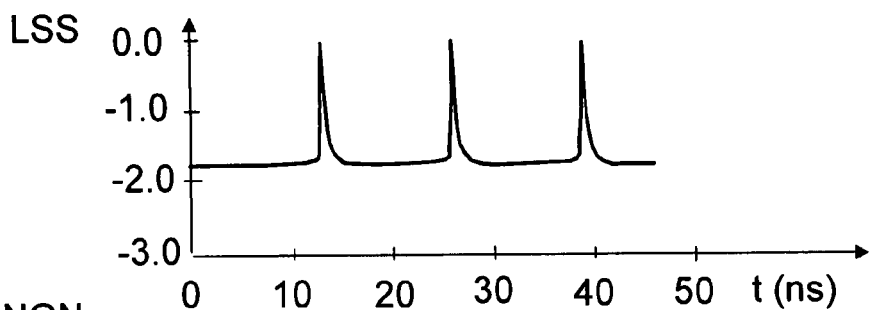
FIG. 11b shows temporal evolution of loss provided by the saturable absorber during the same time period as in FIG. 11a, FIG. 11c shows temporal evolution of net gain provided by the gain region and the saturable absorber during the same time period as in FIG. 11a, FIG. 11d shows temporal evolution of output power provided by the emitter during the same time period as in FIG. 11a, FIG. 11e shows temporal evolution of output power during a single laser pulse according to FIG. 11d.

FIG. 11b shows the temporal evolution of loss LSS provided by the saturable absorber 40, corresponding to the events shown in FIG. 11a. The ordinate values show the loss LSS in logarithmic scale. The optical loss in the absorber is substantially constant until the optical intensity reaches a predetermined limit. Above this limit, the losses in the saturable absorber decrease with the increasing intensity. Consequently, the leading edge of a light pulse B1 results in a fast change in the losses in the saturable absorber and the absorber saturates. In other words, the leading edge of the light pulses is associated with a rapid decrease in the losses. The losses are increased again after launching of a pulse.

Figure 11C:
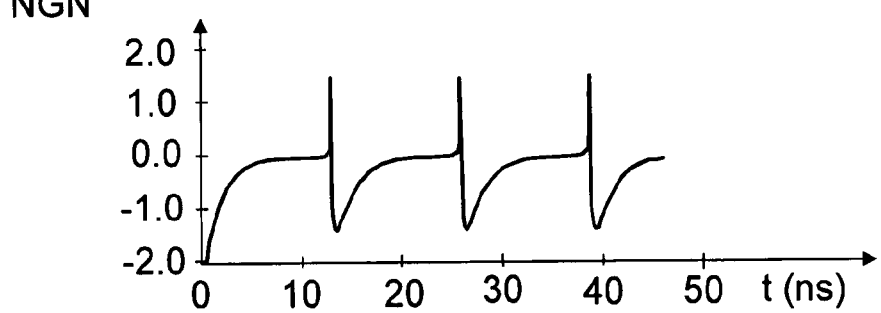

FIG. 11c shows temporal evolution of the net gain NGN in the light emitter E1, corresponding to the events shown in FIGS. 11a and 11b. The ordinate values show the net gain LSS in logarithmic scale. The operating state of the emitter E1 is during most of the time such that the gain is equal to the losses. However, saturation of the absorption in the absorber 40 causes a temporary situation in which the gain provided by the gain region 20 substantially exceeds the losses. The positive net gain leads to a drastic amplification of optical intensity in the emitter E1 and leads consequently to launching of a light pulse B1. However, subsequent depletion of the gain region 20 rapidly restores the net gain to a substantially zero value.

Figure 11D:
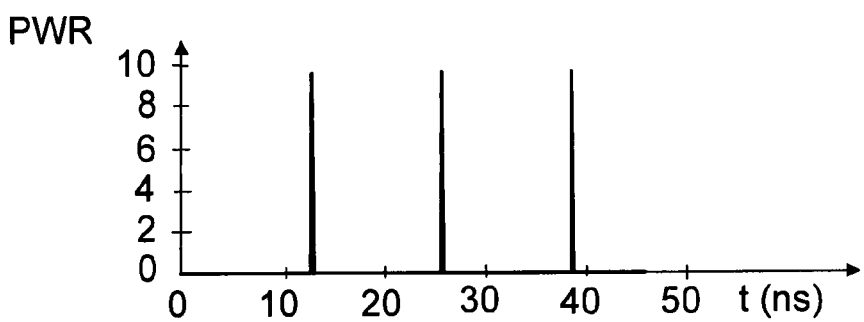
Figure 11E:
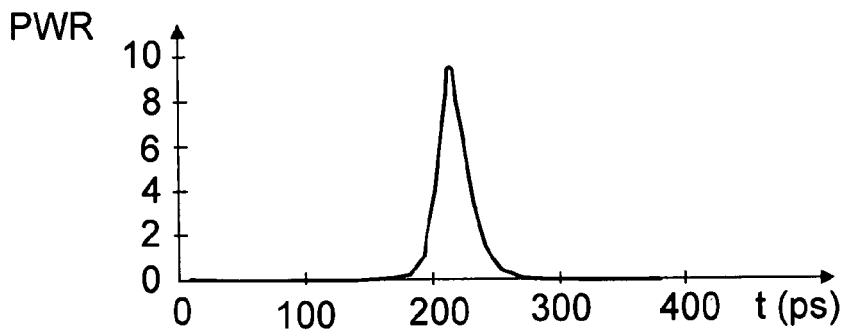

FIG. 11d shows the temporal evolution of optical power PWR generated by the light emitter E1 in watts (W), corresponding to the events shown in FIGS. 11a-11c. FIG. 11e shows the temporal evolution of optical power PWR of a single pulse, in a magnified time scale. The time shown in FIG. 11e is expressed in picoseconds.

The operation of a laser light emitter having a saturable absorber is also described in the article "Modeling of Q-switched semiconductor lasers based on type-II quantum wells: Increasing the pulse energy and peak power", by J. Khurgin, I. Vurgaftman and J. R. Meyer, in Applied Physics Letters, pp. 2631-2633, Vol 80 No. 15, 15 Apr. 2002.

Active Q-switching means that the bias voltage of the saturable absorber 40 is varied at a predetermined rate between a first predetermined level and a second predetermined level. Setting of the bias voltage to the first level initiates generation of a single light pulse B1, and setting of the bias voltage to the second level prevents formation of the light pulses B1. The first level may be e.g. substantially zero voltage or positive voltage, and the second level may be a negative bias voltage, which is selected to cause a high absorption in the saturable absorber 40. The light pulses B1 are generated at the rate of the variation of the bias voltage. The duration of an individual pulse may be e.g. in the range of 50 ps to 1 µs, and also the temporal separation between subsequent pulses may be e.g. in the range of 1 ns to 10 µs.

Semi-passive Q-switching means that generation of the light pulses B1 by passive Q-switching is enabled or disabled by varying the bias voltage of the saturable absorber 40. The bias voltage of the saturable absorber 40 is varied between a first predetermined level and a second predetermined level. Setting of the bias voltage to a first negative level enables generation of the short light pulses B1, and setting of the bias voltage to a second more negative level prevents generation of the light pulses. The time-averaged intensity of the output beam may be adjusted between 0% and 100% by changing a duty cycle. In other words, the apparent intensity may be controlled by pulse width modulation. As noticed before, the integration time of a human eye is in the order of 10 ms, and a human viewer perceives the time-averaged intensity over a time period of approximately 10 ms. The time period between successive pulse sequences may be e.g. in the range of 5 ns to 10 µs. Each pulse sequence may consist of a plurality of light pulses having temporal separation which is by several orders of magnitude shorter than the time period between successive pulse sequences.

Semi-passive Q-switching allows rapid modulation of the visible output intensity at a frequency which is e.g. in the range of 50 MHz to 1 GHz, while also providing a high efficiency of converting electrical energy into visible light. When compared with active Q-switching, the light generated by semi-passive Q-switching is substantially less coherent, and therefore more suitable for visual presentations.

Alternatively, the second predetermined voltage level may also be selected in such a way that the device 400 operates in continuous wave CW mode. However, in CW mode the peak optical power and consequently the second harmonic generation efficiency is substantially lower.

The lasing of the light-emitting device 400 may also be controlled by modulating the bias voltage of the gain region 20. However, modulation of the bias voltage of the gain region 20 is less efficient than modulation of the bias voltage of the saturable absorber 40. Higher modulation frequencies may be implemented by modulating the saturable absorber 40 than by modulating the gain region 20. Furthermore, semi-passive Q-switching by modulating the bias voltage of the saturable absorber 40 may allow a thermally more stable operation than modulation of the current of the gain region 20.

The optical power of an emitter E1 may be controlled by adjusting the bias current of the gain regions 20, as well as by adjusting the bias voltage of the saturable absorber 40.

The light-emitting device 400 may comprise additional filters or gratings to absorb or separate the fundamental light beam B1 from the frequency-doubled light beam B2.

The wavelengths of the emitters E1 may be selected such that e.g. a wavelength 625 nm (red light), 532 nm (green light), or 465 nm (blue light) may be generated by the frequency doubling. The emitters E1a, E1b, E1c of an array A1 may be adapted to emit the same or slightly different wavelengths. Providing slightly different wavelengths reduces further the speckle contrast.

Red, green and blue light may be needed to select a color from the RGB-gamut. Three or more different light-emitting devices may be used. For example, green light may be provided by frequency-doubling 1064 nm light provided by an emitter E1 based on InGaAs-quantum wells (Indium Gallium Arsenide). Blue light may be provided by frequency-doubling 930 nm light provided by an emitter E1 based on InGaAs-quantum wells. Red light may be provided by frequency-doubling 1250 nm light provided by an emitter E1 based on InGaAs(N)-quantum wells (Indium Gallium Arsenide Nitride).

The different colors may be generated by using separate nonlinear crystals 140. Alternatively, a single nonlinear crystal 140 may have separate zones for generating different colors.

The color provided by a plurality of emitters may be adjusted by separately controlling the operating current of the gain regions 20 and/or by controlling the bias voltage of the saturable absorbers 40 of emitters, which have different wavelengths. Consequently, the relative fraction of red, green and blue light generated in the nonlinear crystals may be controlled.

Figure 12A:
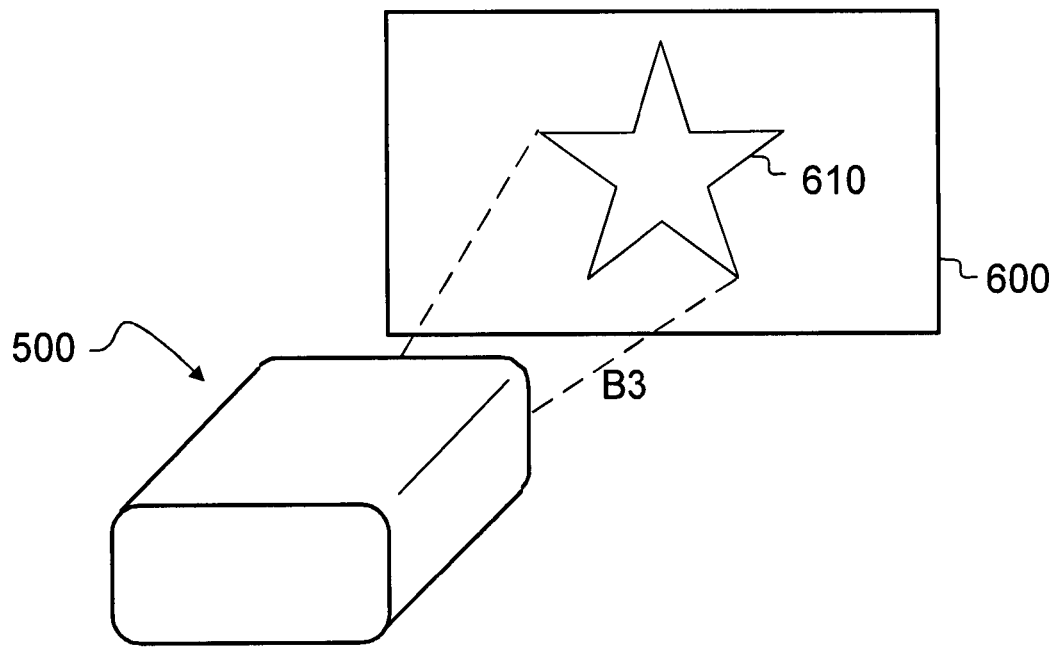
FIG. 12a shows, in a three-dimensional view, a projector.

Referring to FIG. 12a, an image projecting device 500 may be adapted to project light rays B3 onto an external screen in order to display an image 610 to be viewed by one or more persons. The average optical power of the beam B3 may be e.g. in the range of 0.05 to 5 W. Displaying images to a large audience may require even more optical power, e.g. in the range of 5 to 100 W. The image 610 may be a monochromatic image or a color image. The image 610 may be a still image or a video image.

Figure 12B:
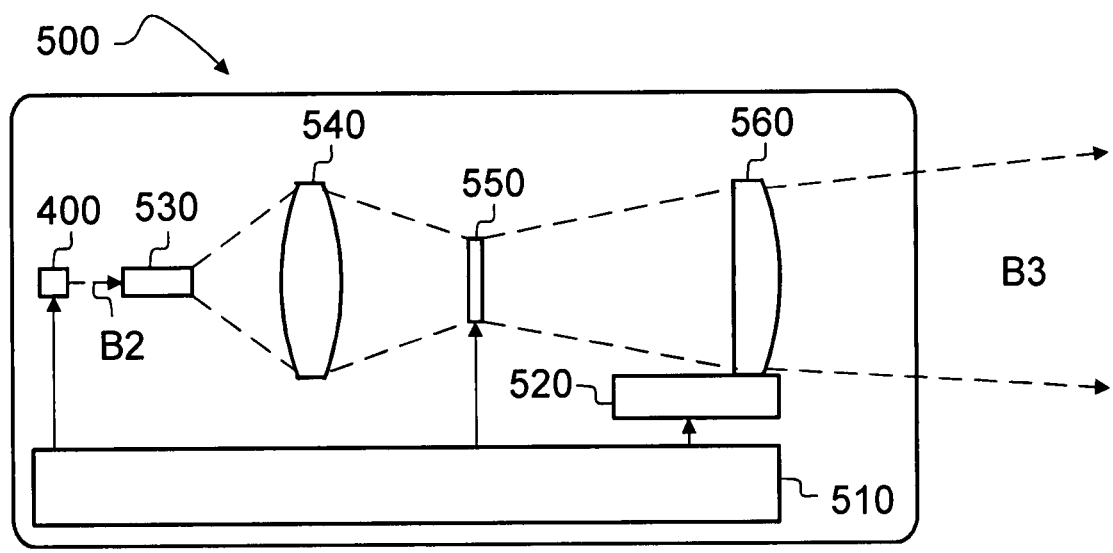
FIG. 12b shows, by way of example, components of a projector.

Referring to FIG. 12b, the image projecting device 500 may comprise a light source 400, an optical spatial integrator 530, a condenser 540, a modulator 550, and projecting optics 560. The light source 400 may be a light emitting device 400 according to the present invention. The light source 400 may provide a spatially non-uniform beam of visible light B2. The light beam B2 is made uniform in the spatial integrator 530, which may be e.g. an optical fiber having a sufficient length. The integrator 530 may provide a substantially uniform beam which is directed to the modulator 550 by the condenser 540. The condenser 540 may be implemented e.g. by one or more lenses or mirror surfaces. The condenser 540 may also be adapted to act as a collimator. The modulator 550 may be e.g. a two-dimensional miniature liquid crystal display or an array of micromechanically moved mirrors (MEMS display). A reflective set-up may be used instead of the transmissive arrangement shown in FIG. 12b. Illuminated pixels generated by the modulator 550 are subsequently imaged to the screen 600 by the projecting optics 560. The projecting optics 560 may be implemented by one or more lenses or mirror surfaces. The projecting device 500 may further comprise an actuator 520 to adjust the distance between the array 550 and the optics 560, in order to focus the projected image 620. The light-emitting device 400, the modulator 550 and the focusing actuator 520 may be controlled by a control unit 510.

The projecting device 500 may comprise three separate modulators 550 and three separate light-emitting devices 400 to implement projecting in colors, e.g. a red-emitting device 400, a green-emitting device 400, and a blue emitting device 400 in order to allow projection of colors selected from the RGB-gamut. The projecting device 500 may comprise one red-emitting device 400, two green-emitting devices and one blue-emitting device 400 to implement a RGGB color system.

A single two-dimensional modulator array 550 illuminated with red, green, and blue light beams may also be used to implement projecting in colors, when said beams impinge on the array from different angles. Reflected light is subsequently combined and projected to the screen 600 to form a color image 610.

The projecting device 500 may also be implemented by scanning a light beam or beams provided by one or more light emitting devices 400 by one or more beam-steering devices and by modulating the optical intensity of said light beams. The beam directing device may also be e.g. a fast micro electromechanical (MEMS) mirror, an acousto-optic deflector, or a rotating or moving holographic deflector.

Figure 12C:
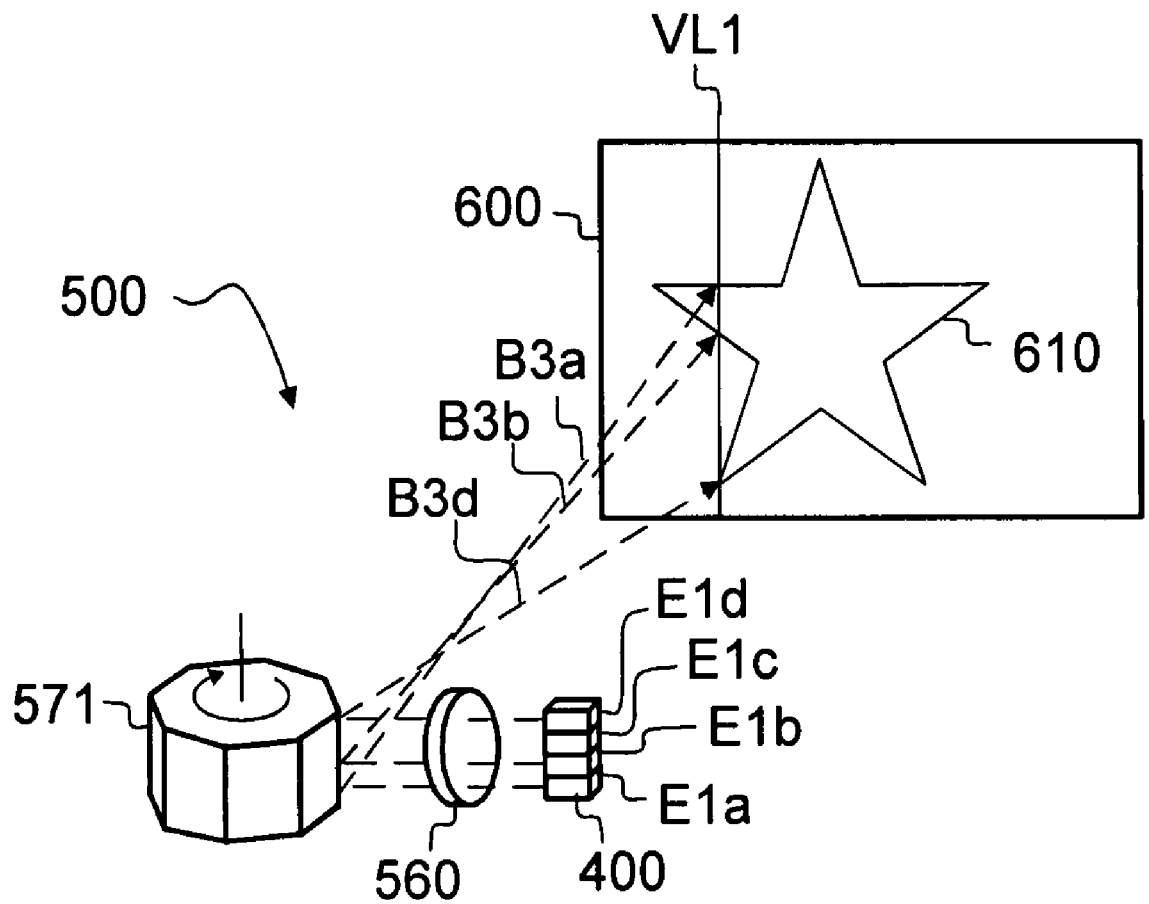
FIG. 12c shows, by way of example, a projector comprising a beam steering unit.

Referring to FIG. 12c, an image projecting device 500 may be implemented by using one or more light-emitting devices 400 which comprise an array A1 of emitters. Light beams B3a, B3b, B3d provided by the emitters E1a, E1b, E1c, E1d may be focused by imaging optics 560 on an external screen 600 to form a plurality of focused points which are on the same vertical line VL1. The horizontal position of the focused points on the screen 600 may be varied by a beam directing device 571, e.g. by a turning mirror which comprises one or more reflecting facets. The intensity of pixels in the vertical line VL1 may be controlled simultaneously by semi-passive Q-switching, i.e. by separately modulating the bias voltage of the saturable absorber 40 of each emitter E1a, E1b, E1c, E1d. Thus, the intensity of the projected beams may be separately controlled at each location of the screen in order to display an image 610. For example, the intensity of a beam (which is not shown in FIG. 12c) provided by emitter E1c may be temporarily set to zero. The image projecting device 500 may also comprise a control unit 510 to modulate the intensity of the beams in order to display the image. Different emitter arrays may be stacked to implement different RGB color projection, or a single array may comprise interlaced emitters for displaying different colors.

The light emitting device 400 may comprise e.g. 512 separately controlled emitters E1a, E1b, E1c, E1d. The rotating mirror 571 may comprise e.g. eight facets, and the mirror 571 may rotate at a rate of e.g. 12.5 revolutions per second. Thus the light beams B3a, B3b, B3d sweep over the screen 100 times per second. Now, a modulation frequency of 20 MHz coupled to a saturable absorber 40 of an emitter would allow 1024 separately controlled pixels in the horizontal direction at the image rate of 100 per second, while also allowing 1% resolution in adjusting the intensity, and allowing complete blanking of the emitted beam during the times when said beam impinges on two adjacent facets of the turning mirror 571.

The light emitting device 400 may also be adapted to provide an array of individually controllable beams, which may be directed by a common rotating mirror having one or more facets.

For the person skilled in the art, it will be clear that modifications and variations of the devices according to the present invention are perceivable. The figures are schematic. The particular embodiments described above with reference to the accompanying drawings are illustrative only and not meant to limit the scope of the invention, which is defined by the appended claims.

What is claimed is:

1. A light-emitting device, comprising:
    an array of light emitters to emit first light pulses, each of said light emitters in turn comprising a saturable absorber and a waveguide having an electrically pumped gain region to emit said first light pulses;
    at least one reflector structure to couple said first light pulses into a nonlinear crystal by changing the direction of said first light pulses by an angle which is in the range of 70 to 110 degrees, said reflector structure comprising a sub-wavelength grating structure to change the polarization of said first light pulses; and
    the nonlinear crystal to generate second light pulses such that the optical frequency of said second light pulses is two times the optical frequency of said first light pulses.

2. The light-emitting device according to claim 1, wherein said nonlinear crystal is periodically poled to provide quasi phase matching.

3. The light-emitting device according to claim 2, wherein said nonlinear crystal is periodically poled to provide optimum conversion efficiency for TM-polarized light.

4. The light-emitting device according to claim 1, further comprising:
    a frequency-selective feedback structure to provide frequency-selective feedback to at least one of said gain regions.

5. The light-emitting device according to claim 4, wherein said nonlinear crystal is periodically poled, and a feedback frequency of said feedback structure is adapted to match with the poling period of said nonlinear crystal, said feedback structure having the same thermal expansion coefficient as said nonlinear crystal.

6. The light-emitting device according to claim 4, wherein said feedback structure is a Bragg grating.

7. The light-emitting device according to claim 1, further comprising:
    a light-concentrating structure to concentrate light into said nonlinear crystal.

8. The light-emitting device according to claim 1, further comprising:
    further waveguides to guide said first light pulses, said further waveguides comprising nonlinear medium.

9. The light-emitting device according to claim 1, wherein said gain regions, said saturable absorbers and said reflector structures are implemented on a common substrate, said first light pulses being adapted to pass through said common substrate.

10. A method of generating light pulses by using an array of light emitters, each light emitter comprising a saturable absorber and a waveguide having an electrically pumped gain region, said method comprising:
- providing first light pulses by using a saturable absorber and a waveguide;
- changing the direction of said first light pulses by an angle which is in the range of 70 to 110 degrees by using a reflector structure;
- changing the polarization of said first light pulses by using a sub-wavelength grating structure; and
- coupling said first light pulses into a nonlinear crystal in order to generate second light pulses such that the optical frequency of said second light pulses is two times the optical frequency of said first light pulses.

11. The method according to claim 10, further comprising:
changing the bias voltage of at least one saturable absorber between a first voltage level and a second voltage level.

12. A projecting device comprising projecting optics and a light-emitting device, said light-emitting device comprising:
- an array of light emitters to emit first light pulses, each of said light emitters in turn comprising a saturable absorber and a waveguide having an electrically pumped gain region to emit said first light pulses;
- at least one reflector structure to couple said first light pulses into a nonlinear crystal by changing the direction of said first light pulses by an angle which is in the range of 70 to 110 degrees, said reflector structure comprising at least one sub-wavelength grating structure to change the polarization of said first light pulses; and
- the nonlinear crystal to generate second light pulses such that the optical frequency of said second light pulses is two times the optical frequency of said first light pulses.

13. The projecting device according to claim 12, further comprising:
a two-dimensional modulator array.

14. The projecting device according to claim 12, further comprising:
at least one beam-directing device.

* * * * *